(12) United States Patent
Furihata et al.

(10) Patent No.: US 7,760,571 B2
(45) Date of Patent: Jul. 20, 2010

(54) IMAGE MEMORY ARCHITECTURE FOR ACHIEVING HIGH SPEED ACCESS

(75) Inventors: Hirobumi Furihata, Kanagawa (JP); Junyou Shioda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 1563 days.

(21) Appl. No.: 11/052,859

(22) Filed: Feb. 9, 2005

(65) Prior Publication Data
US 2005/0206955 A1 Sep. 22, 2005

(30) Foreign Application Priority Data
Feb. 10, 2004 (JP) ............... 2004-034286

(51) Int. Cl.
*G11C 7/00* (2006.01)
*G11C 7/10* (2006.01)
*G11C 8/00* (2006.01)
(52) U.S. Cl. ............. 365/220; 365/189.08; 365/230.01
(58) Field of Classification Search ................. 365/220, 365/189.08, 230.01
See application file for complete search history.

(56) References Cited
U.S. PATENT DOCUMENTS 4,882,708 A * 11/1989 Hayakawa et al. ..... 365/189.04
4,958,326 A * 9/1990 Sakurai ................. 365/185.06
5,285,413 A * 2/1994 Miyauchi et al. ....... 365/189.04
5,917,770 A 6/1999 Tanaka
5,920,883 A * 7/1999 Tamaki et al. ............... 711/101
6,236,683 B1 * 5/2001 Mougeat et al. ........ 375/240.16
2001/0002177 A1 * 5/2001 Ayukawa et al. ....... 365/189.04

FOREIGN PATENT DOCUMENTS

JP 7-295535 11/1995
WO WO 03/060921 A1 7/2003

OTHER PUBLICATIONS

European Search Report dated Oct. 17, 2005.

* cited by examiner

*Primary Examiner*—Ly D Pham
(74) *Attorney, Agent, or Firm*—McGinn IP Law Group, PLLC

(57) ABSTRACT

An image memory is composed of a memory cell array, first and second area selecting circuits, and a write circuit. The memory cell array includes memory elements arrayed in rows and columns, each of the memory elements being adapted to store pixel data. The first area selecting circuit is adapted to select a plurality of row addresses at the same time, and the second area selecting circuit is adapted to select a plurality of column addresses at the same time. The write circuit is adapted to write same pixel data into selected memory elements out of the memory elements, the selected memory elements being associated with the selected row addresses and column addresses.

12 Claims, 16 Drawing Sheets

Fig. 3A
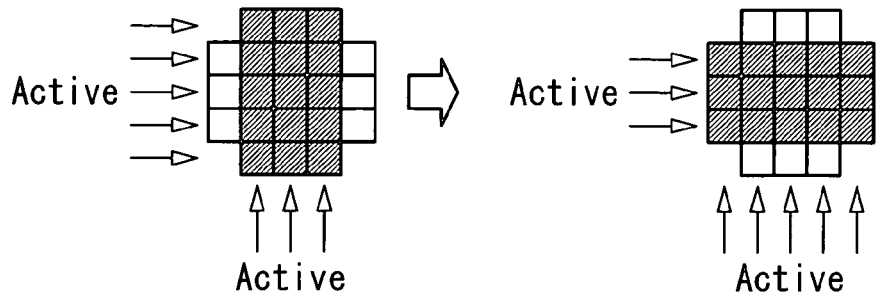
Fig. 3B
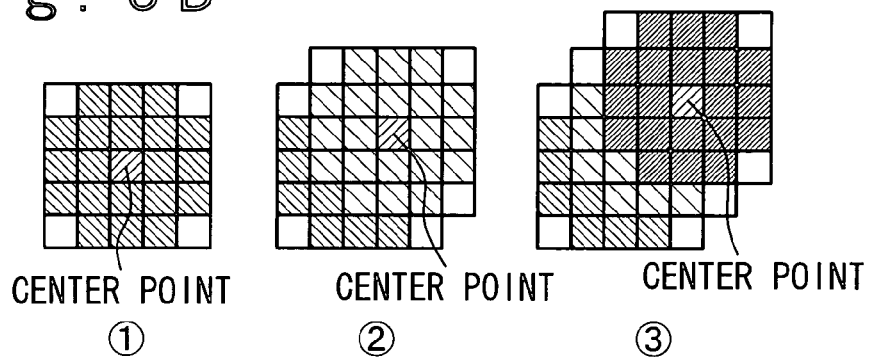
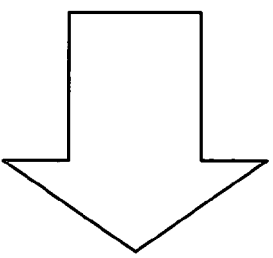
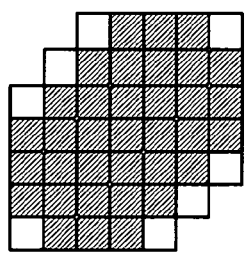
Fig. 3C
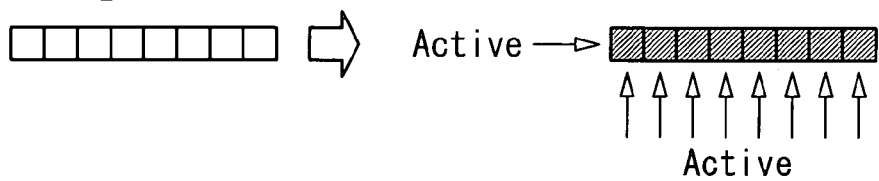

| COLOR REFERENCE NUMBER | COLOR |
|---|---|
| 0 | TRANSPARENT |
| 1 | BLUE |
| 2 | RED |
| 3 | YELLOW |

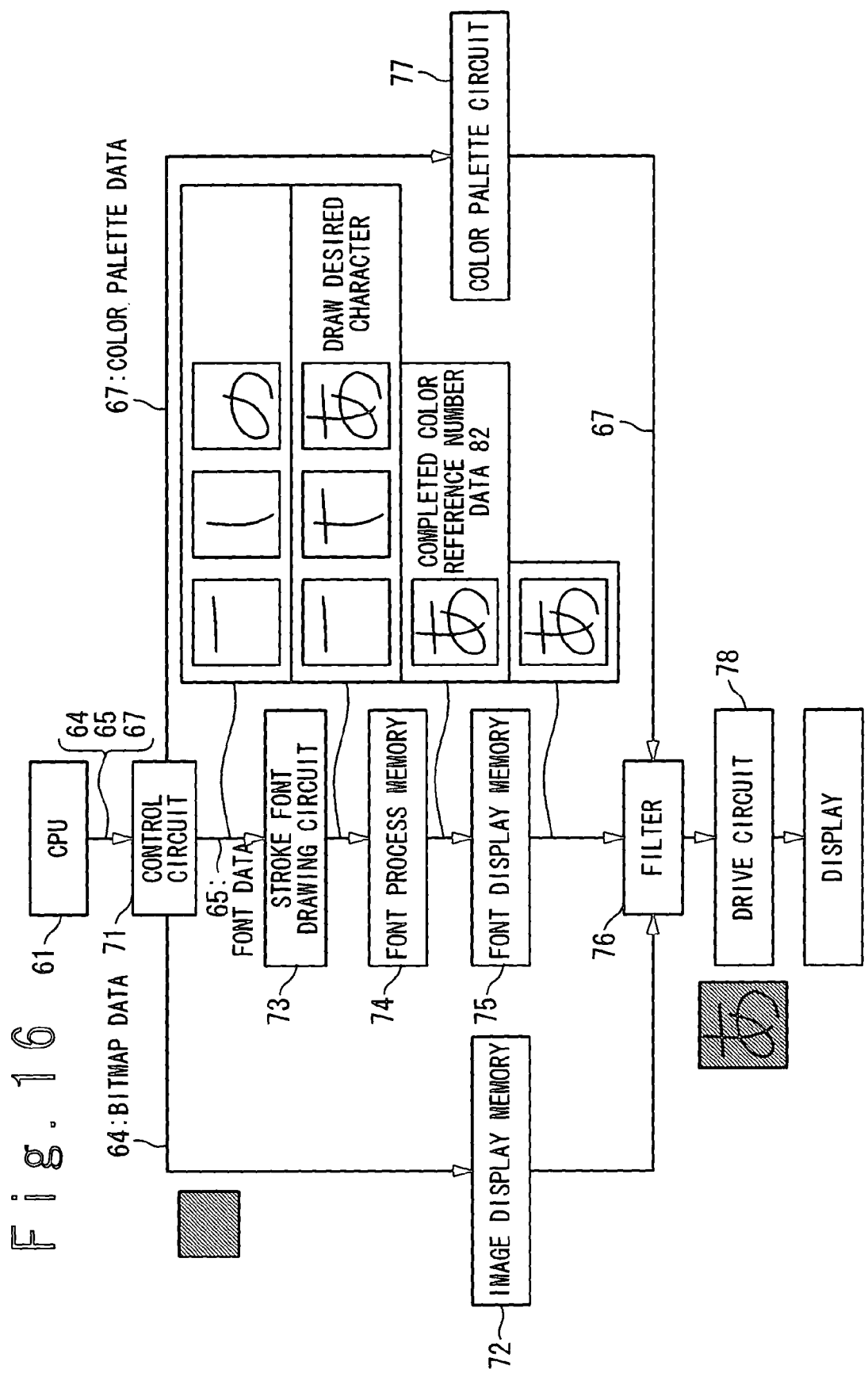

IMAGE MEMORY ARCHITECTURE FOR ACHIEVING HIGH SPEED ACCESS

BACKGROUND OF THE INVENTION

1. Field of the Invention

The present invention relates to image memories and image processing apparatuses using the same. More specifically, the present invention relates to improvement in methods for writing image data onto image memories.

2. Description of the Related Art

Display devices, such as liquid crystal displays, often incorporate an image memory for storing image data. Such display devices are designed to store image data generated by an image processor, such as a CPU and a digital signal processor, and to display images using the image data stored in the image memory.

Improving the access speed to the image memory is one of the important requirements for enhancing the image processing speed within the display device. Japanese Laid-open Patent Application No. H07-295535, for instance, discloses a data processing system that improves the access speed to the image memory by concurrently updating the pixel data for each pixel.

SUMMARY OF THE INVENTION

The inventors have discovered that there is still room for improvement in the access speed to the image memory with regard to the conventional data processing system.

In an aspect of the present invention, an image memory is composed of a memory cell array, first and second area selecting circuits, and a write circuit. The memory cell array includes memory elements arrayed in rows and columns, each of the memory elements being adapted to store pixel data. The first area selecting circuit is adapted to select a plurality of row addresses at the same time, and the second area selecting circuit is adapted to select a plurality of column addresses at the same time. The write circuit is adapted to write same pixel data into selected memory elements out of the memory elements, the selected memory elements being associated with the selected row addresses and column addresses.

Such image memory architecture is adapted to write pixel data for multiple pixels onto the image memory at the same time, and thereby effectively enhances the access speed to the image memory.

In another aspect of the present invention, an image processing apparatus is composed of a drawing circuit and an image memory. The drawing circuit is designed to define a rectangular area within an image so that the rectangular area incorporates pixels associated with same pixel data. The image memory is adapted to store the image. The image memory includes a memory cell array, first and second area selecting circuit, and a write circuit. The memory cell array includes memory elements arrayed in rows and columns. The first area selecting circuit is adapted to select a plurality of row addresses associated with the rectangular area at the same time, and the second area selecting circuit is adapted to select a plurality of column addresses associated with the rectangular area at the same time. The write circuit is adapted to write same pixel data into selected memory elements out of the memory elements, the selected memory elements being associated with the selected row addresses and column addresses.

In still another aspect of the present invention, a controller driver is composed of a control circuit, a drawing circuit, an image memory, a filter circuit, and a drive circuit. The control circuit externally receives image bitmap data associated with an image, and font data associated with a character. The drawing circuit is designed to define a rectangular area within the character so that the rectangular area incorporates pixels associated with same pixel data. The image memory is used for storing character image data associated with the character. The filter circuit is adapted to synthesize the image bitmap data and the character image data to develop synthesized image bitmap data. The drive circuit driving a display panel in response to the synthesized image bitmap data. The image memory includes a memory cell array, first and second area selecting circuits, and a write circuit. The memory cell array is composed of memory elements arrayed in rows and columns. The first area selecting circuit is adapted to select a plurality of row addresses associated with the rectangular area at the same time, and the second area selecting circuit adapted to select a plurality of column addresses associated with the rectangular area at the same time. The write circuit is adapted to write the same pixel data into selected memory elements out of the memory elements to develop the character image data incorporating the same pixel data onto the memory cell array, the selected memory elements being associated with the selected row addresses and column addresses.

In still another aspect of the present invention, a method for writing image data onto an image memory including memory elements arrayed in rows and columns is composed of:

selecting a plurality of row addresses at the same time;

selecting a plurality of column addresses at the same time; and writing same pixel data into selected ones of the memory elements out of the memory elements, the selected memory elements being associated with the selected row addresses and column addresses.

BRIEF DESCRIPTION OF THE DRAWINGS

A better understanding of the present invention is made by reading a detailed description in conjunction with the accompanying drawings, in which:

FIG. 3A illustratively depicts one preferred write operation for a rectangular area in the first embodiment;

FIG. 3B illustratively depicts another preferred write operation for a rectangular area in the first embodiment;

FIG. 3C illustratively shows still another preferred write operation for a rectangular area in the first embodiment;

FIG. 15 is a conceptual diagram illustrating contents of color palette data in the third embodiment; and FIG. 16 is a schematic block diagram illustrating operations of the display device in the third embodiment.

DESCRIPTION OF THE PREFERRED EMBODIMENTS

It should be understood that the following indexes are merely provided in order to achieve better understandings of a detailed description of the present invention.

First Embodiment

1) Entire Device Structure

Figure 1:
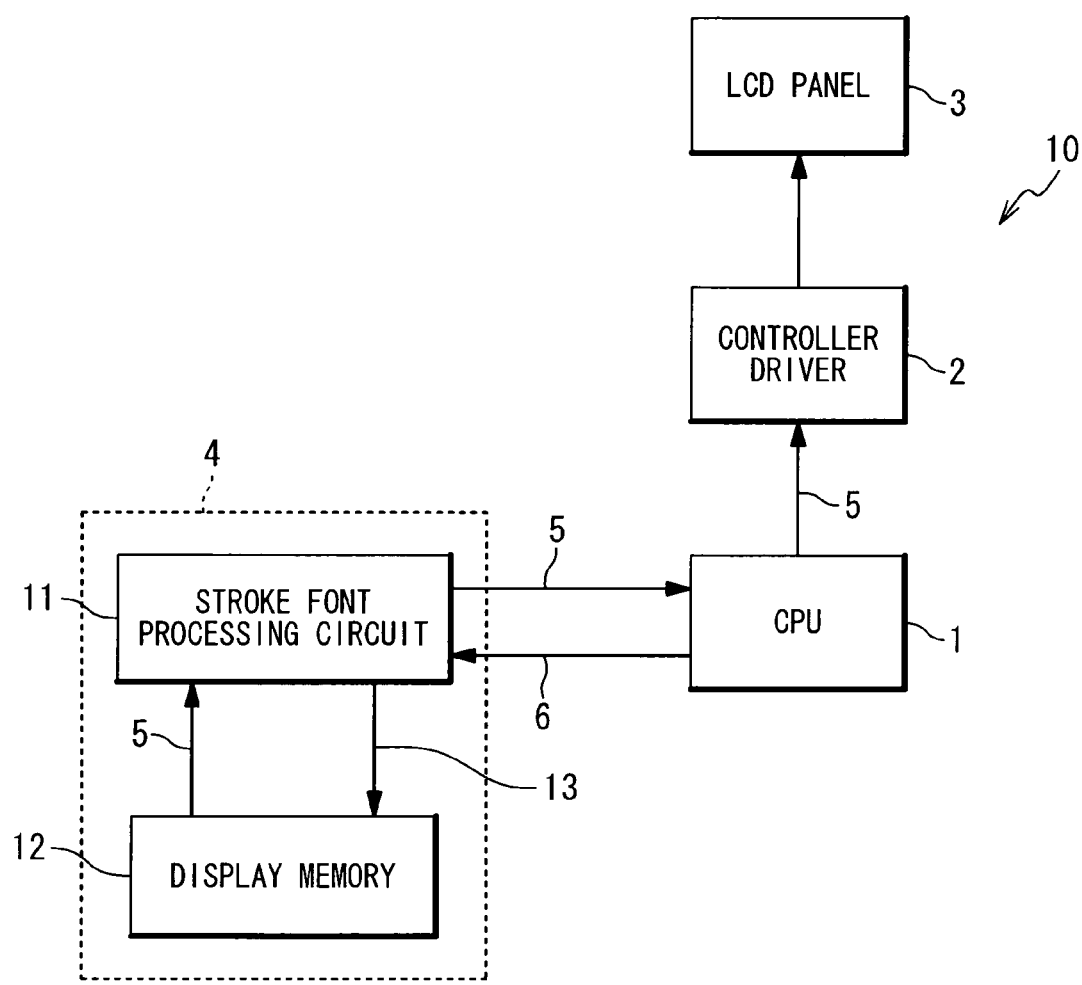
FIG. 1 is a schematic block diagram illustrating an exemplary arrangement of a display device in a first embodiment of the present invention.

FIG. 1 schematically shows an exemplary structure of a display device 10 according to a first embodiment of the present invention. In this embodiment, the display device 10 is adapted to achieve high speed processing of stroke font data. Specifically, the display device 10 is equipped with a CPU (central processing unit) 1, a controller driver 2, an LCD (liquid crystal display) panel 3, and a stroke font processing circuit 4. The LCD panel 3 incorporates pixels arrayed in a matrix. The x-y coordinate system is defined on the LCD panel 3 by a set of x and y axes, the x axis being defined along the horizontal direction of the LCD panel 3, and the y axis is defined along the vertical direction. The respective pixels of the LCD panel 3 may be addressed by an x address (namely, column address) and a y address (namely, row address).

The CPU 1 generates font data 6 associated with characters contained in a display image to be displayed on the LCD panel 3. The font data 6 is generated in a stroke font format, which represents each character with a shape and sort of a line. Specifically, the font data 6 is composed of commands, each representing a line incorporated in the associated character. Each command includes coordinates of control points, sort data indicative of a sort of the line, pixel data of pixels incorporated within the line, width data representative of a width of the line. The control points are used to define the position and the shape of the line. The pixel data typically include color data representative the colors of the relevant pixels in an RGB format. In a typical architecture, the font data 6 is generated using a font memory, which stores therein font data for all the usable characters.

The stroke font processing circuit 4 is designed to generate the image data of the display image composed of the characters. In this embodiment, the image data is generated in a bitmap format. It should be understood that image data produced by the stroke font processing circuit 4 will be referred to as "bitmap data 5" hereinafter. The bitmap data 5 is composed of pixel data for designating the color of each pixel within the LCD panel 3. The produced bitmap data 5 is transmitted via the CPU 1 to the controller driver 2.

In response to the bitmap data 5, the controller driver 2 drives the LCD panel 3 to display desired characters on the LCD panel 3.

The stroke font processing circuit 4 is equipped with a stroke font drawing circuit 11 and an image memory 12. The stroke font drawing circuit 11 sequentially interprets commands contained in the font data 6 to produce the bitmap data 5 of the corresponding characters in response to the font data 6 onto the image memory 12. Such an operation that the stroke font drawing circuit 11 produces bitmap data 5 associated with characters onto the image memory 12 may be also represented using the term "to draw characters", hereinafter. The image memory 12 is used as a work area for generating the bitmap data 5. After the stroke font drawing circuit 11 completes "to draw characters" onto the image memory 12, and the associated bitmap data 5 is developed onto the image memory 12. The bitmap data 5 generated by the stroke font drawing circuit 11 is then transmitted via the CPU 1 to the controller driver 2.

Figure 2A:
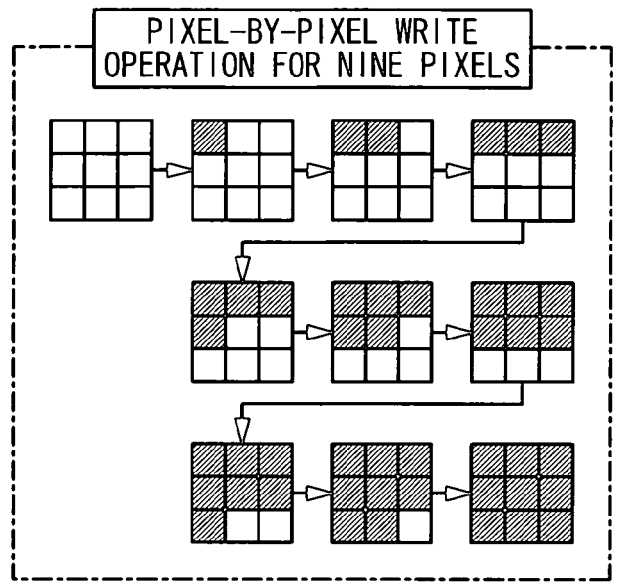
FIG. 2A illustratively represents a writing operation of a conventional image memory.

Improving in write speeds of pixel data onto the image memory 12 is one of the important aspects for enhancing the operation speed of the stroke font processing circuit 4. As shown in FIG. 2A, a conventional image memory architecture write pixel data onto an image memory "pixel-by-pixel". For instance, a writing operation as to pixel data associated with pixels arranged in three rows and three columns is subdivided into 9 times of write operations. In this conventional writing method, multiple writing cycles are required in order to write the pixel data; the total number of necessary writing cycles being equal to the number of the pixels associated to the pixel data. This conventional method is not suitable for high-speed generation of the bitmap data 5.

Figure 2B:
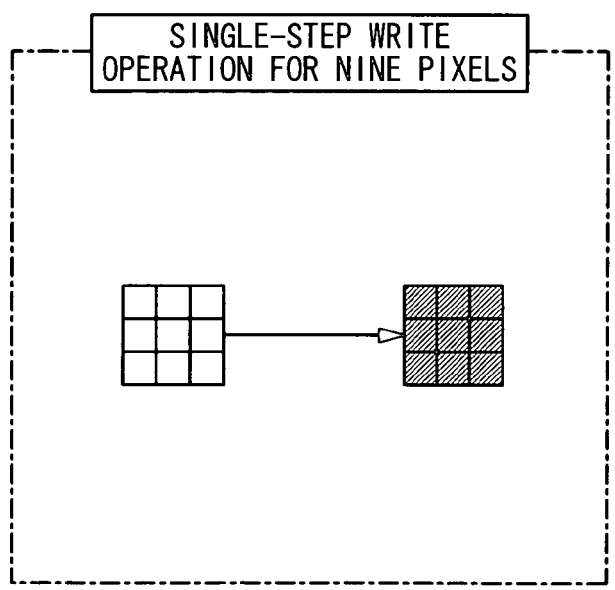
FIG. 2B illustratively represents a writing operation of an image memory in the first embodiment.

On the other hand, the display device 10 of this embodiment achieves high-speed data write of the pixel data onto the image memory 12 through making use of a fact that each character is drawn with a single color; all the pixels relevant to the character are programmed with the same pixel data associated with the color of the character. Specifically, as shown in FIG. 2B, the image memory 12 of the first embodiment is designed to simultaneously write the pixel data onto the image memory 12 for a set of pixels relevant to a certain rectangular area involved in a character, when the pixels are to be programmed with the same pixel data. Such a data writing process is advantageous for writing the image data of the image constructed of characters, because pixels relevant to a character are normally programmed with the same pixel data. Exemplary structures and operations of the font drawing circuit 11 and the image memory 12 will be described in detail in the following.

2) Structure and Operation of Stroke Font Drawing Circuit

As previously described, the stroke font drawing circuit 11 provides "drawing of characters" onto the image memory 12 in response to the font data 6.

Schematically, the stroke font drawing circuit 11 operates as follows: The stroke font drawing circuit 11 recognizes a shape of a character to be displayed from the font data 6, and defines a set of rectangular areas in the recognized character so that the pixels within each rectangular area are programmed with the same pixel data. As will be described later, two or more of the rectangular areas used to represent a character may be overlapped with one another.

Additionally, as shown in FIG. 1, the font drawing circuit 11 produces rectangular area data 13 each associated with the rectangular areas. The rectangular area data 13 includes coordinates of a reference point of the associated rectangular area, a width "W" of the associated rectangular area along the x axis direction, a height "h" of the associated rectangular area along the y axis direction, and the pixel data of the pixels contained in the associated rectangular area. The width "W" of each rectangular area is represented by the number of the pixels arranged in one row, and therefore the width "W" is a natural number. Correspondingly, the height "h" of each rectangular area is represented by the number of the pixels arranged in one column. A set of coordinates of the reference point may be referred to as "reference coordinates", hereinafter, and x and y coordinates of the reference point may be denoted by symbols "x0" and "y0", respectively.

The reference coordinates (x0, y0) within the rectangular area data 13 are used to designate a position of each rectangular area. It should be noted that the reference coordinates may be defined as being coordinates of any position within the rectangular area. For instance, the reference coordinates may be defined as being coordinates of the center point of each rectangular area, and/or may be defined as coordinates of the corner(s) of the relevant rectangular area. It should be also noted that the position of each rectangular area is preferably designated by the coordinates of the center point thereof, because this facilitates the calculation of the position of the each rectangular area; the font data 6, represented in the stroke font format, expresses each character with the shapes of the center lines of the relevant character and the sort of the lines (including color of each line). In this embodiment, the reference coordinates (x0, y0) may be defined as the coordinates of the center point of each rectangular area.

The rectangular area data 13 produced by the stroke font drawing circuit 11 is transmitted to the image memory 12. The pixel data of the pixels within the rectangular areas, described in the rectangular area data 13, is written onto the image memory 12 to complete "drawing of the characters". The pixel data of the pixels contained in a certain rectangular area is written onto the image memory 12 at the same time, for achieving high-speed write of the pixel data for the relevant pixels.

3) Structure and Operation of Image Memory

Figure 5:
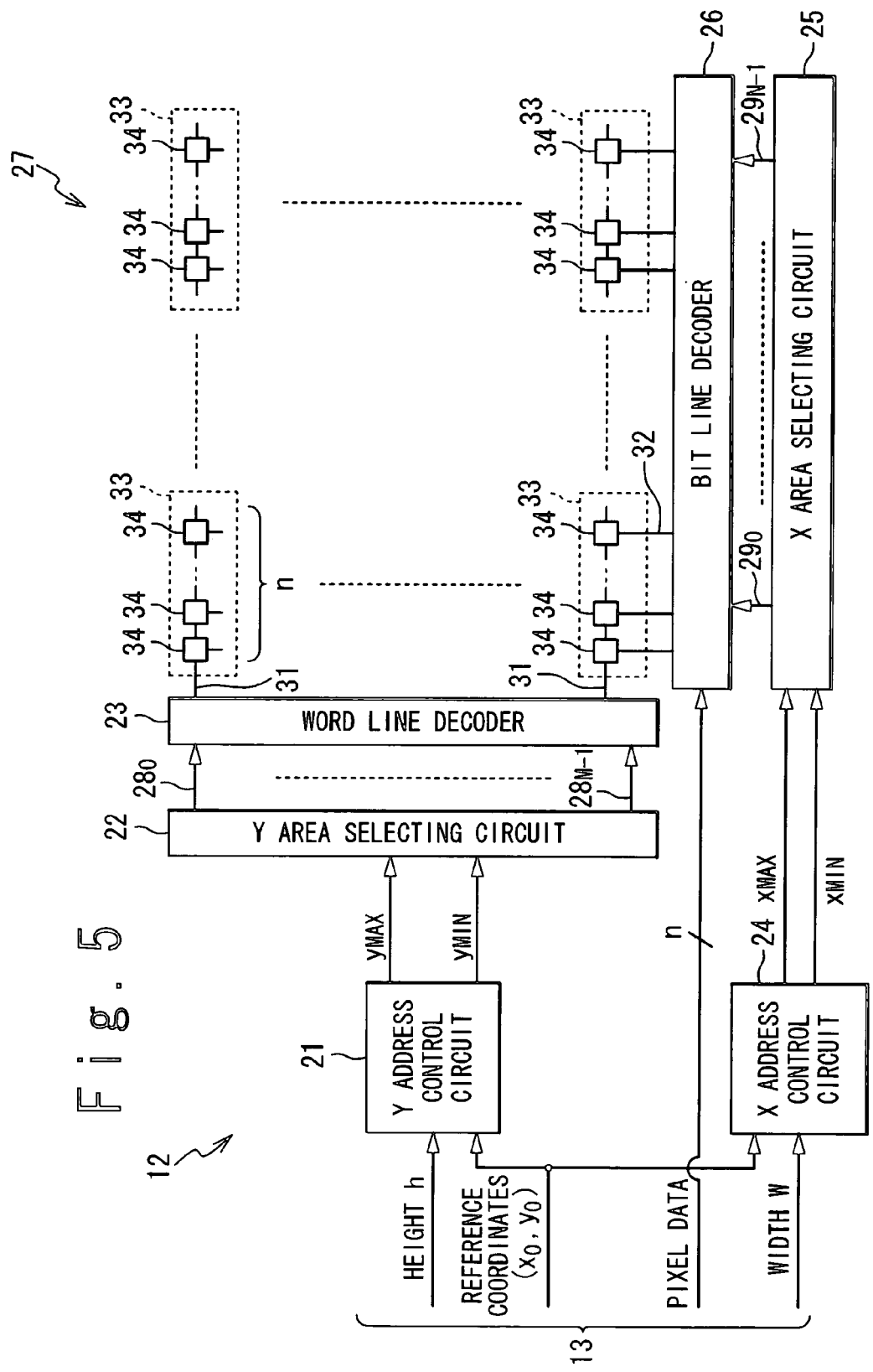
FIG. 5 is a schematic block diagram illustrating an exemplary structure of an image memory in the first embodiment.

FIG. 5 is a block diagram for schematically showing an exemplary structure of the image memory 12. The image memory 12 is composed of a Y address control circuit 21, a Y area selecting circuit 22, a word line decoder 23, an X address control circuit 24, an X area selecting circuit 25, a bit line decoder 26, and a memory cell array 27. The memory cell array 27 is equipped with pixel blocks 33, word lines 31, and bit line 32. The pixel blocks 33 each functions as a pixel data storage element storing the associated pixel data; the pixel blocks 33 are associated with the respective pixels within the LCD panel 3 in the one-to-one correspondence. Each pixel block 33 stores the pixel data of the associated pixel. The pixel blocks 33 are addressable using a set of x and y addresses of the associated pixel. The pixel blocks 33 are each composed of n memory cells 34 arrayed along the horizontal direction (x direction) to store therein n-bit pixel data. In this embodiment, the pixel blocks 33 are each designed to store 24-bit pixel data composed of 8-bit R (red) data, 8-bit G (green) data, and 8-bit B (blue) data. The memory cells 34 are located at the respective intersections of the word lines 31 and the bit lines 32. A set of the memory cells 34 storing the pixel data of a desired pixel is accessible through addressing the desired word line 31 and bit line 32 by using the x and y addresses of the desired pixel.

The Y address control circuit 21 calculates a set of the maximum value "$y_{MAX}$" and minimum value "$y_{MIN}$" of y addresses of the relevant rectangular area indicated in the rectangular area data 13 on the basis of the y reference coordinate "y0" and the height "h" of the relevant rectangular area. Various calculation methods may be used for determining the maximum value $y_{MAX}$ and minimum value of $y_{MIN}$ of the y addresses of the relevant rectangular area.

In one embodiment, different formulas may be used for determining the maximum value $y_{MAX}$ and minimum value $y_{MIN}$ depending on whether the height "h" is an odd number or an even number. In this embodiment, for a height "h" being an odd number, the maximum value $y_{MAX}$ and minimum value $y_{MIN}$ may be calculated using the following formulas:

$y_{MAX}=y0+h/2$, and $y_{MIN}=y0-h/2$, while being calculated using the following formulas:

$y_{MAX}=y0+h/2$, and $y_{MIN}=y0-h/2-1$, for a height "h" being an even number. Alternatively, the maximum value $y_{MAX}$ and minimum value $y_{MIN}$ for a height "h" being an even number may be calculated by the following formulas:

$y_{MAX}=y0+h/2-1$, and $y_{MIN}=y0-h/2$.

In an alternative embodiment, the maximum value $y_{MAX}$ and minimum value $y_{MIN}$ of the y address may be calculated by the following formulas:

$y_{MAX}=y0+h$, and $y_{MIN}=y0$, independently of whether the height "h" is an odd number of an even number. Instead, the maximum value $y_{MAX}$ and minimum value $y_{MIN}$ may be calculated by the following formulas:

$y_{MAX}=y0$, and $y_{MIN}=y0-h$.

The Y area selecting circuit 22 outputs y address signals "$28_0$" to "$28_{M-1}$" to the word line decoder 23 in response to the maximum value $y_{MAX}$ and the minimum value $y_{MIN}$ of the relevant rectangular area. It should be also noted that the symbol "M" denotes a number of rows in which the pixel blocks 33 are arrayed. This implies that the y address of the pixel ranges from 0 to M−1. The Y area selecting circuit 22 activates selected one(s) of the y address signals $28_0$ to $28_{M-1}$ which are associated with the y addresses of $y_{MIN}$ to $y_{MAX}$. It should be understood that two or more of the y addresses may be selected for a single write operation.

The word line decoder 23 activates selected one(s) of the word lines 31 in response to the y address signals $28_0$ to $28_{M-1}$. When a plurality of y addresses are selected, a plurality of word lines associated with selected y addresses are activated at the same time. This provides electrical connections between the associated memory cells 34 and bit lines 32.

Similarly to the Y address control circuit 21, the X address control circuit 24 is designed to calculate the maximum value "$x_{MAX}$" and minimum vale "$x_{MIN}$" of the x addresses of the rectangular area indicated in the rectangular area data 13 on the basis of the x reference coordinate "x0" and the width "W" of the relevant rectangular area. Various calculation methods may be used for determining the maximum value $x_{MAX}$ and minimum value $x_{MIN}$.

In one embodiment, different formulas may be used for determining the maximum value $x_{MAX}$ and minimum value $x_{MIN}$ depending on whether the width "W" is an odd number or an even number. In this embodiment, for a width "W" being an odd number, the maximum value $x_{MAX}$ and minimum value $x_{MIN}$ may be calculated using the following formulas:

$$x_{MAX} = x0 + W/2, \text{ and}$$

$$x_{MIN} = x0 - W/2,$$

while being calculated using the following formulas:

$$x_{MAX} = x0 + W/2, \text{ and}$$

$$x_{MIN} = x0 - W/2 - 1,$$

for a height "h" being an even number. Alternatively, the maximum value $x_{MAX}$ and minimum value $x_{MIN}$ for a height "h" being an even number may be calculated by the following formulas:

$$x_{MAX} = x0 + W/2 - 1, \text{ and}$$

$$x_{MIN} = x0 - W/2.$$

In an alternative embodiment, the maximum value $x_{MAX}$ and minimum value $x_{MIN}$ of the x address may be calculated by the following formulas:

$$x_{MAX} = x0 + W, \text{ and}$$

$$x_{MIN} = x0,$$

independently of whether the width "W" is an odd number of an even number. Instead, the maximum value $x_{MAX}$ and minimum value $x_{MIN}$ may be calculated by the following formulas:

$$x_{MAX} = x0, \text{ and}$$

$$x_{MIN} = x0 - W.$$

The X area selecting circuit 25 provides x address signals $29_0$ to $29_{N-1}$ to the bit line decoder 26 in response to the maximum value $x_{MAX}$ and minimum value $x_{MIN}$ of the x addresses of the relevant rectangular area. The x address signals $29_0$ to $29_{N-1}$ are representative of whether or not the respective x addresses are selected. It should be noted that the symbol "N" denotes the number of columns in which the pixel blocks 42 are arrayed. This implies that the x addresses ranges from 0 to N−1. The X area selecting circuit 25 activates selected one(s) of the x address signals $29_0$ to $29_{N-1}$ which are associated with a set of selected x addresses, that is, the x addresses from $x_{MIN}$ to $x_{MAX}$. It should also be understood that a plurality of x addresses may be selected during a single write operation. Desired one(s) of the pixel blocks 33 are selected using the y address(es) selected by the Y area selecting circuit 22 and the x address(es) selected by the X area selecting circuit 25.

The bit line decoder 26 is responsive to the x address signals $29_0$ to $29_{N-1}$ for connecting selected ones of bit lines 32 associated with the selected x address(es) to the n signal lines used to transfer the pixel data within the rectangular area data 13 to the image memory 12. This completes writing the pixel data into the selected one(s) of the pixel blocks 33, that is, writing the data bits of the pixel data into the associated memory cells 34 of the selected the pixel block(s) 33.

The aforementioned architecture allows the image memory 12 to select the pixel blocks 33 positioned over multiple rows and/or columns positioned within the relevant rectangular area, and to write the pixel data onto the selected pixel blocks 33 at the same time.

Figure 6:
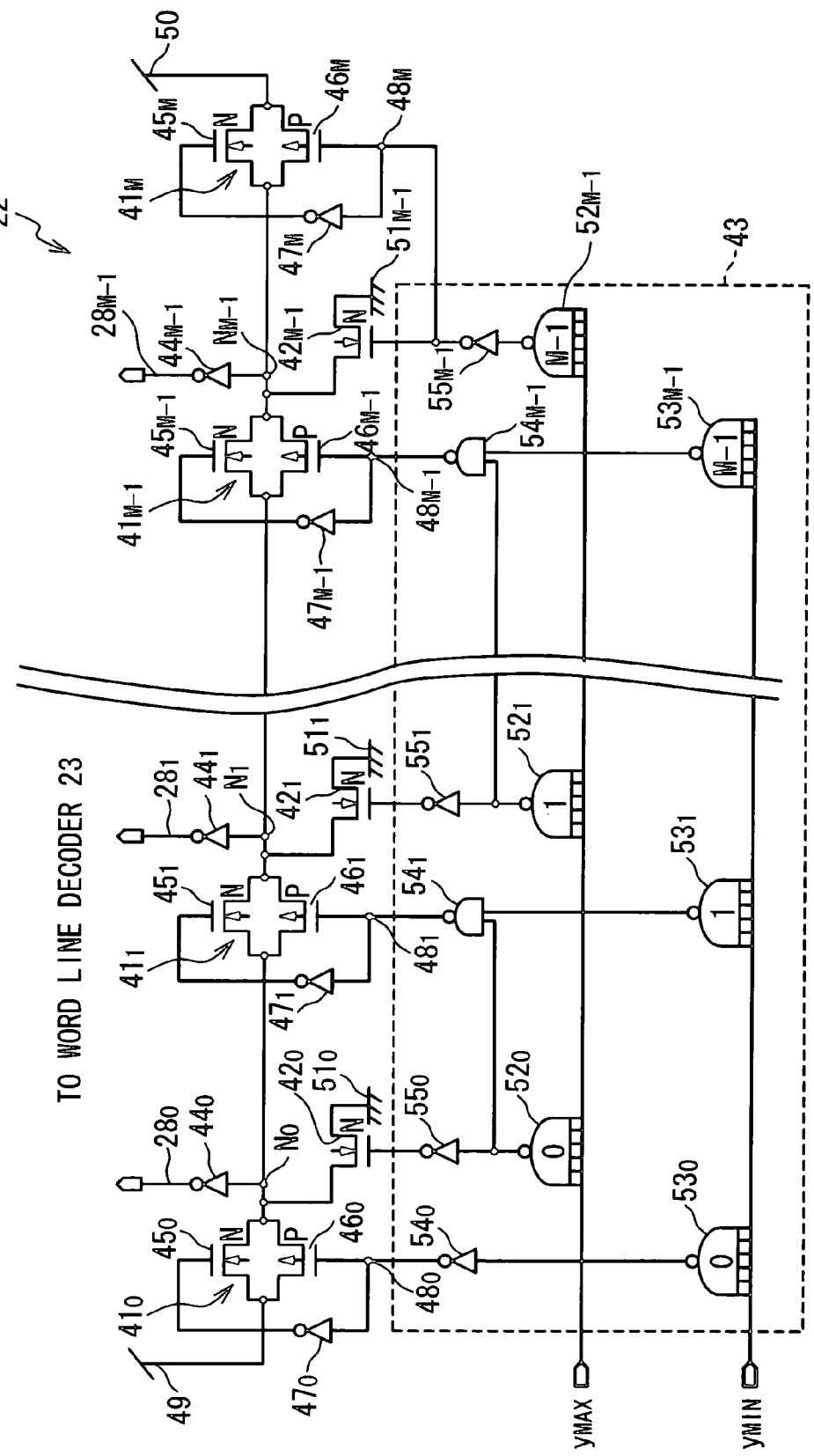
FIG. 6 is a circuit diagram illustrating an exemplary structure of a Y area selecting circuit in the first embodiment.

4) Structure and Operation of Y Area selecting Circuit and X Area Selecting Circuit FIG. 6 is a circuit diagram illustrating an exemplary structure of the Y area selecting circuit 22. The Y area selecting circuit 22 is provided with transfer gates $41_0$ to $41_{M-1}$, N-channel MOS transistors $42_0$ to $42_{M-1}$, a logic circuit 43, and output inverters $44_0$ to $44_{M-1}$. The transfer gates $41_0$ to $41_{M-1}$ and the N-channel MOS transistors $42_0$ to $42_{M-1}$ function as switch elements.

The transfer gates $41_0$ to $41_{M-1}$ are series-connected between power supply terminals 49 and 50. The transfer gate $41_0$, positioned at one end of the series-connected transfer gates, is interposed between the power supply terminal 49 and an output node $N_0$. The transfer gate $41_{M-1}$, positioned at another end of the series-connected transfer gates, is interposed between an output mode $N_{M-1}$ and the power supply terminal 50. The transfer gate $41_i$ is interposed between an output node $N_{i-1}$ and an output node $N_i$. In other words, the output node $N_i$ electrically couples the transfer gate $41_i$ to the transfer gate $41_{i+1}$.

Each transfer gate $41_i$ is equipped with an N-channel MOS transistor $45_i$, a P-channel MOS transistor $46_i$, and an inverter $47_i$. The N-channel MOS transistor $45_i$ and the P-channel MOS transistor $46_i$ have commonly-coupled sources and drains. The input of the inverter $47_i$ and the gate of the MOS transistor 46 are connected to a control terminal $48_i$, and the output of the inverter $47_i$ is connected to the gate of the N-channel MOS transistor $46_i$.

The transfer gates $41_0$ to $41_{M-1}$ are turned on or off in response to potentials of the control terminals $48_0$ to $48_{M-1}$, respectively. When the control terminals $48_0$ to $48_{M-1}$ are pulled down to the ground potential, the transfer gates $41_0$ to $41_{M-1}$ are turned off. When the control terminals $48_0$ to $48_{M-1}$ are pulled up to the power supply potential, on the other hand, the transfer gates $41_0$ to $41_{M-1}$ are turned on.

The N-channel MOS transistors $42_0$ to $42_{M-1}$ are interposed between the output nodes $N_0$ to $N_{M-1}$ and the ground terminals $51_0$ to $51_{M-1}$, respectively. A drain of the N-channel MOS transistor $42_i$ is connected to the output node $N_i$, and a source thereof is connected to the ground terminal $51_i$.

The logic circuit 43 controls the transfer gates $41_0$ to $41_{M-1}$ and the N-channel MOS transistors $42_0$ to $42_{M-1}$ in response to the maximum value $y_{MAX}$ and the minimum value $y_{MIN}$ of the y addresses of the relevant rectangular area.

A detailed structure of the logic circuit 43 is given in the following. The logic circuit 43 is equipped with decoder circuits $52_0$ to $52_{M-1}$, decoder circuits $53_0$ to "$53_{M-1}$, an inverter $54_0$, NAND gates $54_2$ to $54_{M-1}$, and inverters $55_0$ to $55_{M-1}$. The decoder circuits $52_0$ to $52_{M-1}$ are designed to pulls up or down the outputs thereof in response to the maximum value $y_{MAX}$ of the y address of the rectangular; the decoder circuit $52_i$ pulls down the output to the "Low" level when the maximum value $y_{MAX}$ is "i"; otherwise the decoder circuit $52_i$ pulls up the output to the "High" level. Correspondingly, the decoder circuit $53_i$ pulls down the output to the "Low" level when the maximum value $y_{MIN}$ is "i", and pulls up the output to the "High" level, when the maximum value $y_{MIN}$ is not "i". The outputs of the decoder circuits $52_0$, to $52_{M-1}$ are connected via the inverters $55_0$ to $55_{M-1}$ to the gates of the N-channel MOS transistors $42_0$ to $42_{M-1}$, respectively. An output of the decoder circuit $52_{M-1}$ located at the end is further connected via the inverter $55_{M-1}$ to the control terminal $48_M$ of the transfer gate $41_M$.

On the other hand, the output of the decoder circuit $53_0$, which receives the minimum value $y_{MIN}$, is connected to an input of the inverter $54_0$, and an output of the inverter $54_0$ is connected to the control terminal $48_0$. The outputs of the remaining decoder circuits $54_2$ to $53_{M-1}$ are connected to first inputs of NAND gates $54_2$ to $54_{M-1}$, respectively. Second inputs of the NAND gates $54_2$ to $54_{M-1}$ are connected to the outputs of the decoder circuits $52_0$ to $52_{M-1}$, respectively. The outputs of the NAND gates $54_2$ to $54_{M-1}$ are connected to the control terminals $48_2$ to $48_{M-1}$, respectively.

Inputs of the output inverters $44_0$ to $44_{M-1}$ are connected to output nodes "$N_0$" to "$N_{M-1}$", respectively. The y address signals $28_0$ to $28_{M-1}$ are outputted from the outputs of the output inverters $44_0$ to $44_{M-1}$.

Figure 7:
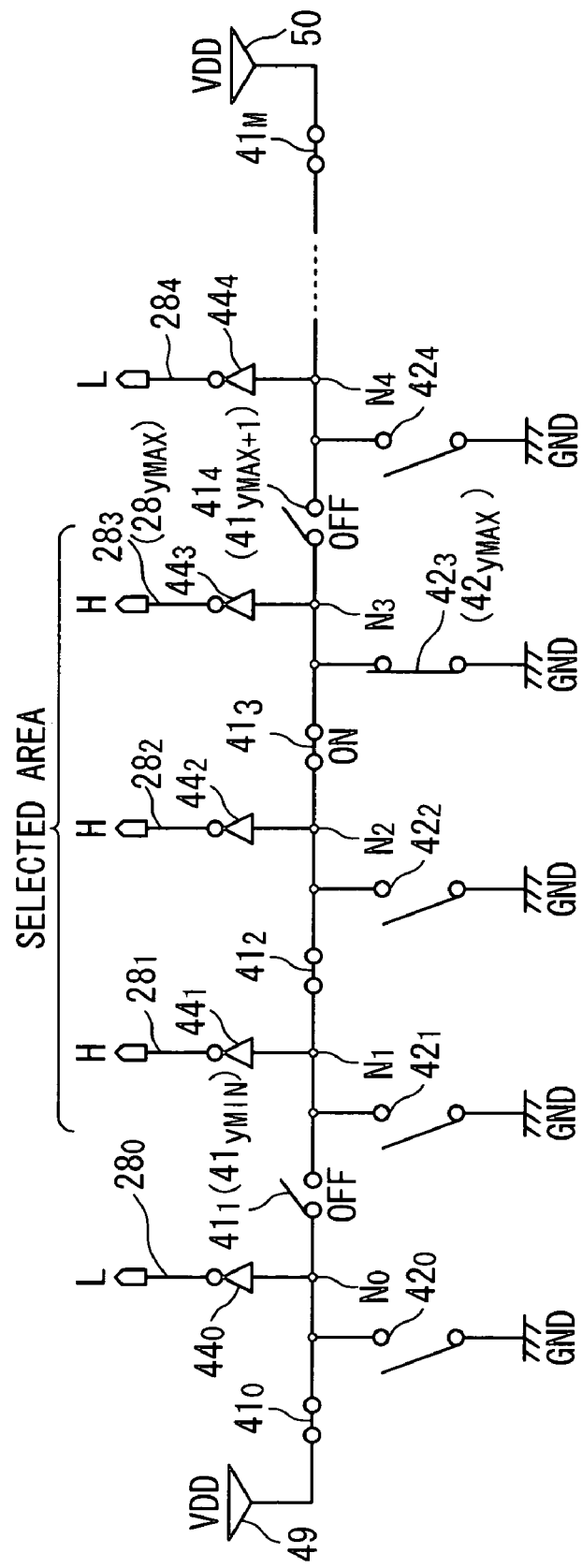
FIG. 7 is a conceptual diagram for representing operations of the Y area selecting circuit in the first embodiment

FIG. 7 is a conceptual diagram illustrating an exemplary operation of the Y area selecting circuit 22; the illustration in FIG. 7 assumes that the maximum value $y_{MAX}$ is "3" and the minimum value $y_{MIN}$ is "1". When the logic circuit 43 receives the maximum value $y_{MAX}$ and minimum value $y_{MIN}$ of the y addresses of the relevant rectangular area, the logic circuit 43 turns off the transfer gate "$41_{yMAX+1}$", and a transfer gate "$41_{yMIN}$", while turning on the remaining transfer gates 41. Further, the logic circuit 43 turns on the N-channel MOS transistor $42_{yMAX}$ and turns off the remaining N-channel MOS transistors 42. This results in that the output nodes $N_{yMIN}$ to $N_{yMAX}$ are pulled down to the "Low" level, and the remaining output nodes are pulled up to the "High" level. This results in that the y address signals $28_{yMIN}$ to $28_{yMAX}$ are pulled up to the "High" level while the remaining y address signals 28 are pulled down to the "Low" level, in other words, the y addresses $y_{MIN}$ to $y_{MAX}$, associated with the relevant rectangular area, are selected.

Enhancing the operation speed of the Y area selecting circuit 22 requires high-speed pull-up of the output nodes associated with the Y address signals 28 to be deactivated; however, the structure of the Y area selecting circuit 22 shown in FIG. 6 may be unsuitable for high-speed pull-up of the relevant output nodes. Specifically, the structure of the Y area selecting circuit 22 shown in FIG. 6 requires connecting the desired output nodes via one ore more transfer gates 41 to either the power supply terminal 49 or the power supply terminal 50 for pulling up the desired output nodes. Therefore, the pull-up of the desired output nodes may undesirably require a long duration due to the on-resistance of the transfer gates 41, in particular, for a case that the output nodes to be pulled up are connected via a large number of the transfer gates 41 to the power supply terminal 49 (or power supply terminal 50).

Figure 8:
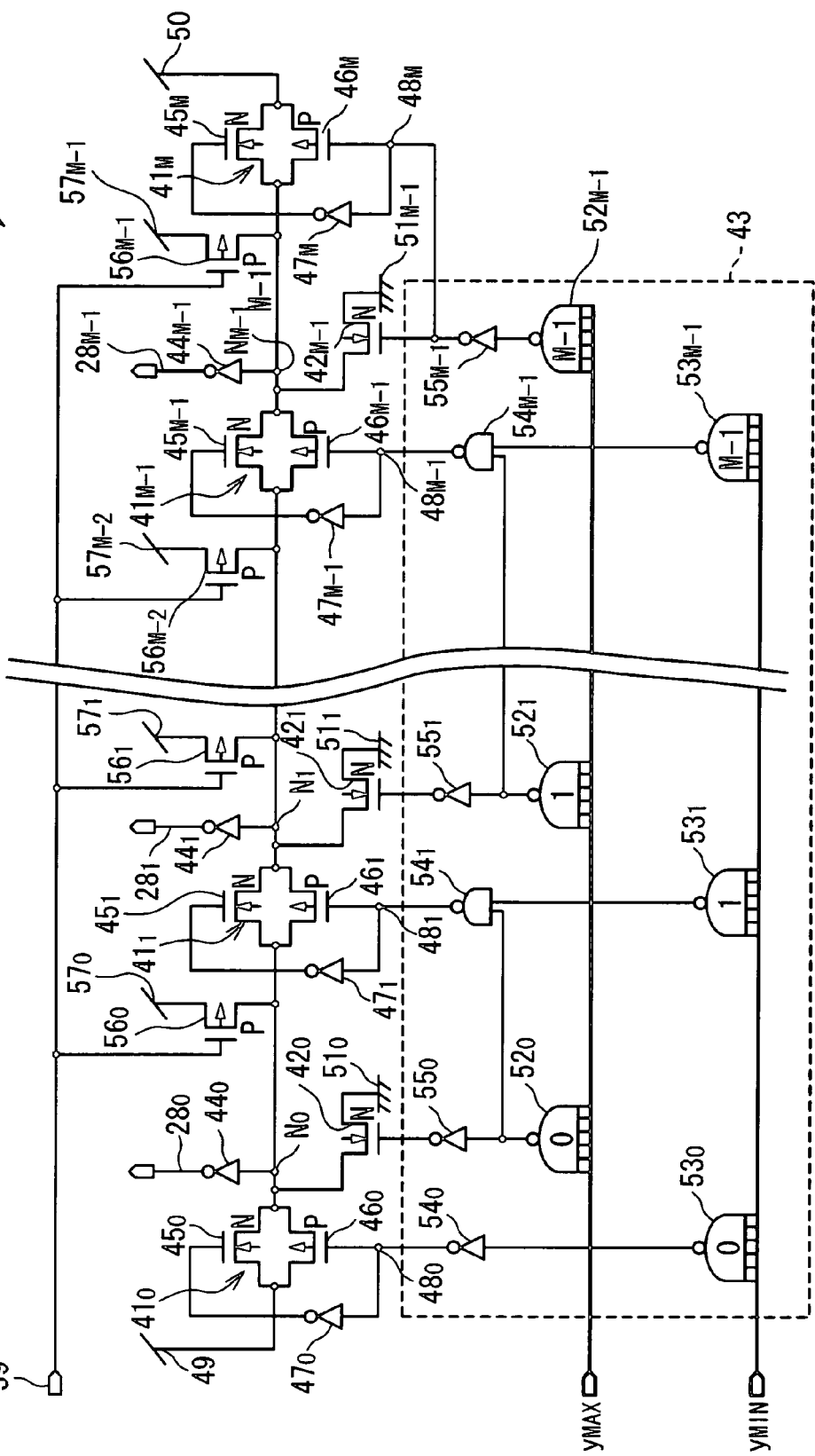
FIG. 8 is a circuit diagram illustrating another exemplary structure of the Y area selecting circuit in the first embodiment.

In order to reduce the duration required to pull up the desired output nodes, it is preferable that the output nodes $N_0$ to $N_{M-1}$ are precharged to "High" level before the y address signals $28_0$ to $28_{M-1}$ are driven to desired levels. FIG. 8 illustrates a preferred structure of the Y area selecting circuit 22, which is adapted to precharge the output nodes NO to $N_{M-1}$ to the "High" level. In this structure, a set of P-channel MOS transistors $56_0$ to $56_{M-1}$ are additionally provided for the Y area selecting circuit 22. Sources of the P-channel MOS transistors $56_0$ to $56_{M-1}$ are connected to power supply terminals $57_0$ to $57_{M-1}$, and drains thereof are connected to the output nodes $N_0$ to $N_{M-1}$. A precharge control signal 59 is inputted to gates of the P-channel MOS transistors $56_0$ to $56_{M-1}$. The output nodes $N_0$ to $N_{M-1}$ are electrically connected to the powers supply terminals $57_0$ to $57_{M-1}$, respectively in response to the pull-down of the precharge control signal 57.

Another approach for enhancing the operation speed of the Y area selecting circuit 22 is to provide high-speed pull-down for the output nodes associated with the Y address signals $28_0$ to $29_{M-1}$ to be activated. This approach is preferably achieved through pulling down the desired output nodes to the "Low" level using two or more of the N-channel MOS transistors 42.

Figure 9:
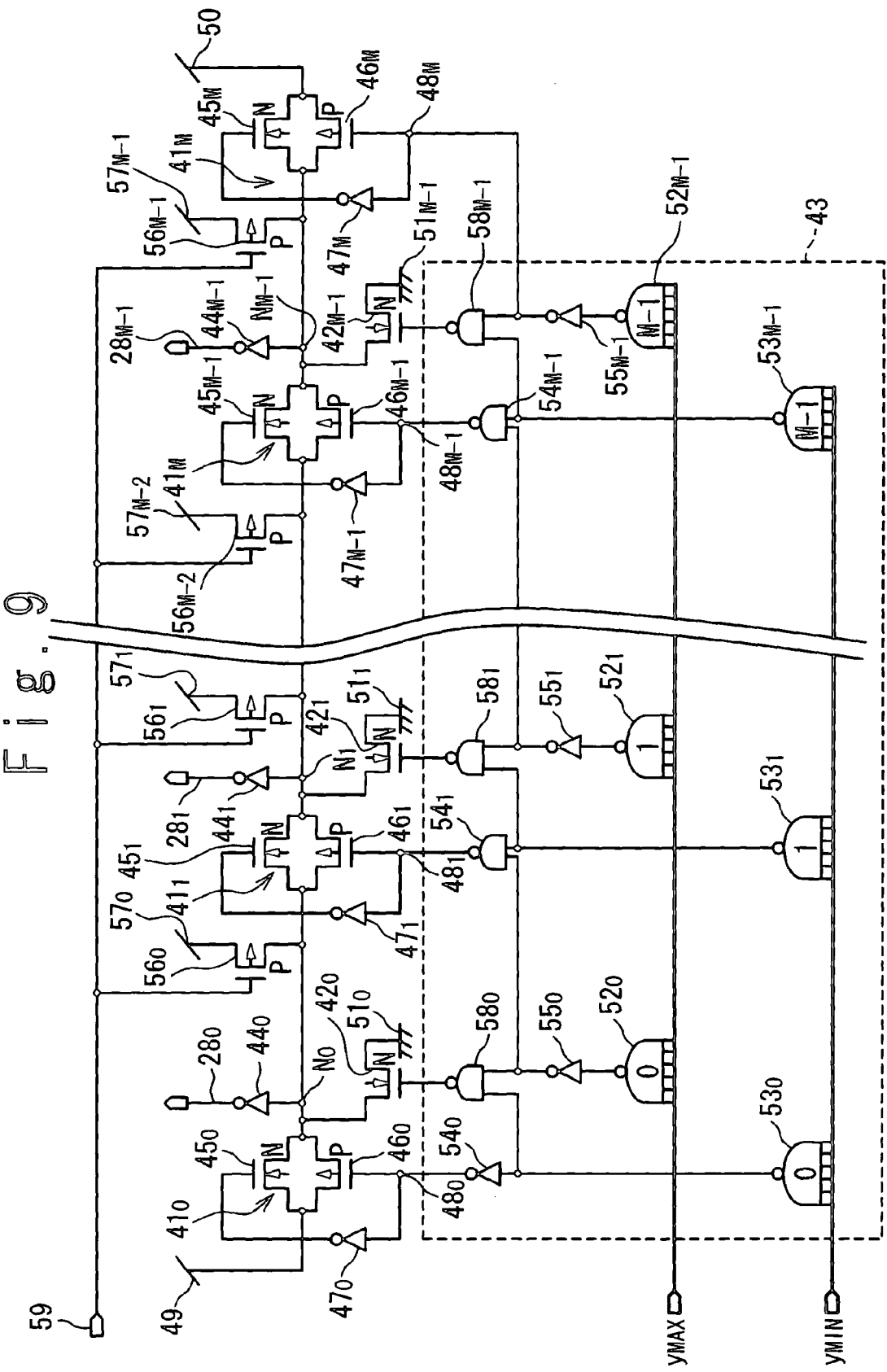
FIG. 9 is a circuit diagram illustrating still another exemplary structure of the Y area selecting circuit in the first embodiment.

FIG. 9 is a circuit diagram illustrating an exemplary structure of the Y area selecting circuit 22, which is adapted to pull down the desired output nodes using two or more of the MOS transistors 42. The structure of the Y area selecting circuit 22 shown in FIG. 9 is different from that shown in FIG. 8 in the structure of the logic circuit 43; the logic circuit 43 of FIG. 9 additionally includes NAND gates $580$ to $58_{M-1}$. One input of the NAND gate $58_i$ is connected to the output of a first decoder $52_i$ and the output of the second decoder $53_i$, and another input of the NAND gate $58_i$ is connected to the output of the inverter $55_i$. The output of the NAND gate $58_i$ is connected to the gate of the N-channel MOS transistor $42_i$.

Figure 10:
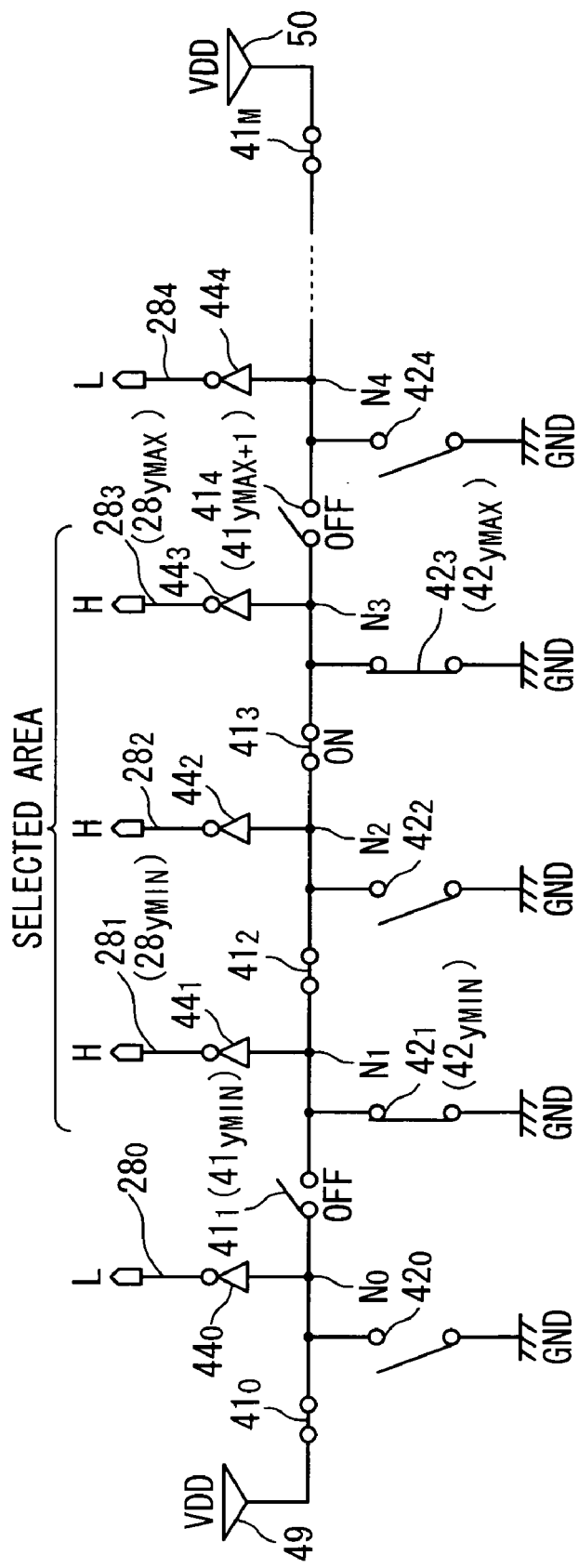
FIG. 10 is a conceptual diagram for representing operations of the Y area selecting circuit in the first embodiment.

FIG. 10 is a conceptual diagram representing operations of the Y area selecting circuit 22 of FIG. 9; the illustration in FIG. 10 assumes that the maximum value $y_{MAX}$ is "3" and the minimum value $y_{MIN}$ is "1". When the logic circuit 43 receives the maximum value $y_{MAX}$ and minimum value $y_{MIN}$ of the y addresses of the rectangular area, the logic circuit 43 turns off the transfer gate $41_{yMAX+1}$ and the transfer gate $41_{yMIN}$, while turning on the remaining transfer gates 41. Additionally, the logic circuit 43 turns on the two N-channel MOS transistors $42_{yMAX}$, $42_{yMIN}$, while turning off the remaining N-channel MOS transistors 42. As a result, the output nodes $N_{yMIN}$ to $N_{yMAX}$ are pulled down to the "Low" level, and the remaining output nodes are pulled up to the "High" level. This results in that the y address signals $28_{yMIN}$ to $28_{yMAX}$ are selectively pulled up to the "High" level, in other words, the y addresses $y_{MIN}$ to $y_{MAX}$, associated with the relevant rectangular area are selected.

As will be understood from FIG. 10, the Y area selecting circuit 22 of FIG. 9 effectively reduces the duration required to pull down the desired output nodes $N_{yMIN}$ to $N_{yMAX}$, through using the two N-channel MOS transistors $42_{yMAX}$ and $42_{yMIN}$ for the pull-down of the desired output nodes $N_{yMIN}$ to $N_{yMAX}$.

It should also be understood that the ground terminal may be alternatively connected to the transfer gates $41_0$ and $41_M$ instead of the power supply terminals 49 and 50; the power supply terminal may be alternatively connected to the N-channel MOS transistors $42_0$ to $42_{M-1}$ instead of the ground terminals $51_0$ to $51_{M-1}$; and the ground terminal may be alternatively to the P-channel transistors $56_0$ to $56_{M-1}$ instead of the power supply terminals $57_0$ to $57_{M-1}$. In this alternative case, it is suitable that transfer gates are used instead of the N-channel MOS transistors $42_0$ to $42_{M-1}$.

The structure and operations of the X-area selecting circuit 25 are basically similar to those of the Y area selecting circuit 22. The difference exists in the number of elements that constitute the X-area selecting circuit 25, and different signals are inputted to or outputted from the X-area selecting circuit 25. The X area selecting circuit 25 receives the maximum value $x_{MAX}$ and minimum value $x_{MIN}$ of the x addresses of the relevant rectangular area instead of the maximum value $y_{MAX}$ and the minimum value $y_{MIN}$ of the y addresses. Furthermore, the X area selecting circuit 25 is designed to output X-address signals $29_0$ to $29_{M-1}$ instead of the Y address signals $28_0$ to $28_{M-1}$. Moreover, the number of the relevant elements is changed in correspondence with the change in the number of address signals to be outputted. A detailed explanation as to the structure and operations of the X area selecting circuit 23 is omitted, because the required modification from the Y area selecting circuit 22 would be apparent to those skilled in the art.

5) Operation of Display Device

As previously described, the display device in the first embodiment is designed to convert the font data 6, represented in the stroke font format, into the bitmap data 5 using the stroke font processing circuit 4, and to drive the LCD panel 3 in response to the bitmap data 5. A detailed description is made of an exemplary process of the conversion of the font data 6 into the bitmap data 5.

Referring back to FIG. 1, the font drawing circuit 11 of the stroke font processing circuit 4 generates the rectangular area data 13 from the font data 6 as described in the following. The font drawing circuit 11 acknowledges shapes of lines which constitute each character to be displayed, and defines a set of rectangular areas for the respective lines so that each rectangular area incorporates pixels to be programmed with the same pixel data; the lines constituting the characters are represented by the set of the rectangular areas. The font drawing circuit 11 then produces the rectangular area data 13 for each of the rectangular areas so that the rectangular area data 13 indicates the x and y reference coordinates x0, and y0, the width "W", the height "h" of the associated rectangular area, and the pixel data with which the associated pixels are programmed. In this embodiment, the x and y reference coordinates x0, and y0 are defined as the center point of each rectangular area.

Appropriate definition of the rectangular areas is effective for achieving the requested data write of the pixel data onto the image memory 12 in a reduced number of steps. In particular, it is effective for reducing the number of steps relevant to the data write of the pixel data to define the rectangular areas so that two or more of the rectangular areas are overlapped with each other.

In one embodiment, as shown in FIG. 3A, pixel data of pixels arranged within a cross-shaped area having the same color may be written onto the image memory 12 in accordance with the below-mentioned two steps: First, pixel data associated with pixels arranged in five rows and three columns within a first rectangular area, which pixels are associated with the same color, is written onto the image memory 12 at the same time. This is followed by concurrently writing pixel data associated with pixels arranged in three rows and five columns within a second rectangular area, which are associated with the same color. It should be noted that the second rectangular area is defined to overlap the first rectangular area. This process effectively reduces the number of steps necessary for write the pixel data associated with the pixels arranged within the cross-shaped area. The aforementioned writing method in connection with the cross-shaped area may be applicable to write pixel data of pixels arranged within an inclined line. In a preferred embodiment, the center point of the cross-shaped area is scanned along the centerline of the inclined line during the write operation of the pixel data associated with the pixels arranged within the inclined line. This effectively achieves the data write of the relevant pixel data with a reduced number of steps.

Furthermore, as represented in FIG. 3C, pixel data associated with pixels arranged within a relevant line extending along the horizontal direction (x direction) may be simultaneously written through defining a rectangular area to cover the whole of the relevant line. The same goes for a line extending along the vertical direction (y direction). Defining a rectangular area in this manner effectively reduces the number of steps necessary for writing the pixel data associated with the pixels arranged within the line extending along either the horizontal direction or the vertical direction.

Figure 4:
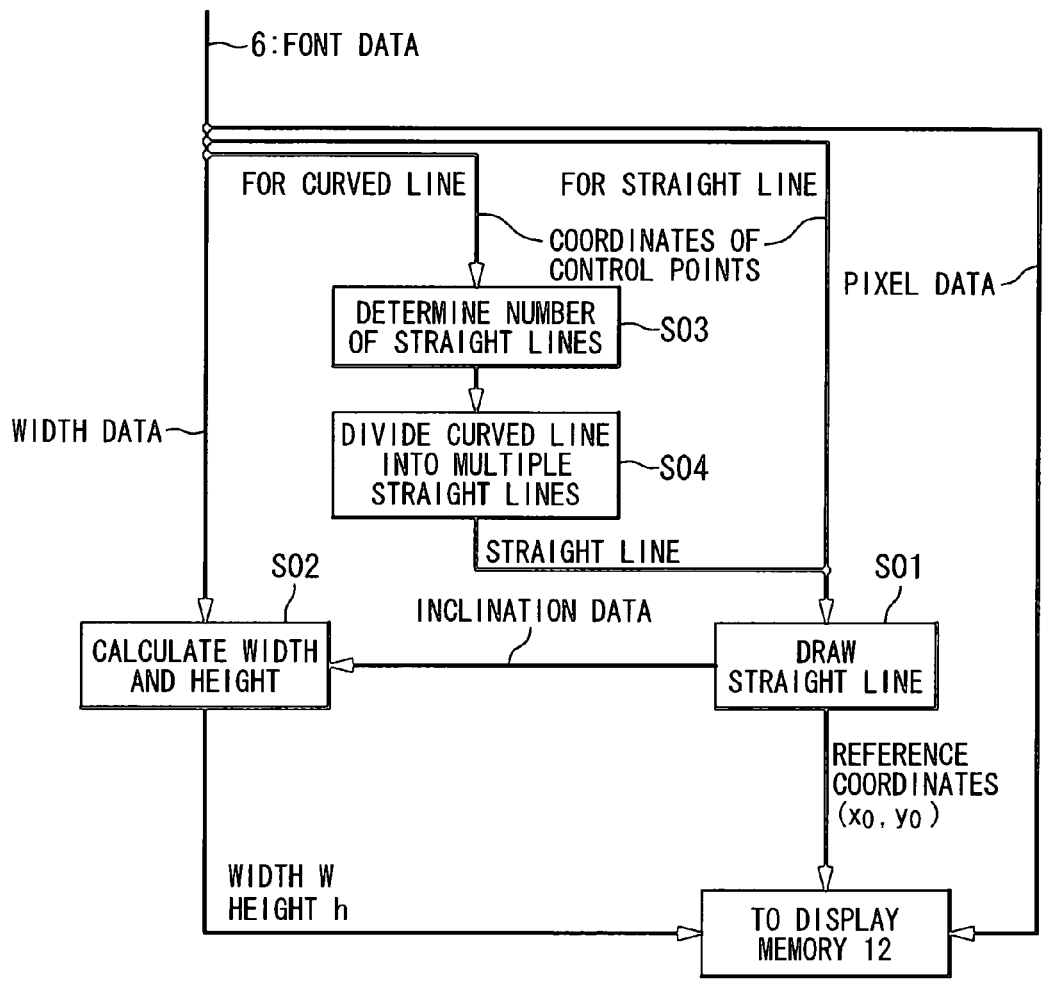
FIG. 4 is a flow chart illustrating an exemplary sequence of generating rectangular area data.

FIG. 4 is a diagram for illustrating a detailed operation of the font drawing circuit 11 for generating the rectangular area data 13. The font drawing circuit 11 provides the below-mentioned process operations for each of the lines described in the font data 6.

The font drawing circuit 11 determines whether each of the lines to be processed is a straight line, or a curved line. In the case that the relevant line is a straight line, the font drawing circuit 11 executes a line drawing calculation at Step S01. In this line drawing calculation, the font drawing circuit 11 calculates a set of x and y reference coordinates x0 and y0, and inclination data representative of an inclination of the straight line for each rectangular area, on the basis of the coordinates of the control points located on both ends of the centerline of the straight line to be processed. Furthermore, the font drawing circuit 11 executes a width/height calculation at Step S02, which involves calculating the width "W" and height "h" of each rectangular area from the inclined data and width data of the relevant straight line described in the font data 6. The rectangular area data 13 is produced through executing the line drawing calculation and the width/height calculation.

The process operations executed in the line drawing calculation and the width/height calculation depends on the inclinations calculated in the line drawing calculation. In the case that the straight line to be processed is a horizontal line (namely, line along x direction), as shown in FIG. 3C, the font drawing circuit 11 defines a rectangular area to cover the horizontal line, in which pixels having the same color are arranged in rows and columns. The font drawing circuit 11 then calculates the x and y reference coordinates x0 and y0 and the width W of the relevant rectangular area from the coordinates of the control points defined on both ends of the centerline of the straight line to be processed. Additionally, the font drawing circuit 11 determines the height "h" of the relevant rectangular area as being the value of the width data of the relevant straight line described in the font data 6. The x and y reference coordinates x0 and y0 are defined so that the x and y reference coordinates x0 and y0 corresponds to the median point of the centerline of the relevant straight line.

A similar process operation is carried out in the case that the straight line to be processed is a vertical line (namely, a line along y direction). The font drawing circuit 11 defines a rectangular area to cover the vertical line, in which pixels having the same color are arranged in rows and columns. The font drawing circuit 11 calculates the height "h" of the rectangular area from coordinates of control points located on both edges of the centerline of this vertical line, and determines the width "W" of the rectangular area as being the value of the width data of the vertical line described in the font data 6.

In such a case that the straight line to be processed is to an inclined line, the font drawing circuit 11 produces the rectangular area data 13 so that the relevant inclined line is expressed by a plurality of rectangular areas. It should also be understood that these plural rectangular areas may be overlapped with each other, as indicated in FIG. 3B. Specifically, the font drawing circuit 11 determines the x and y reference coordinates x0 and y0 of each rectangular area so that the x and y reference coordinates x0 and y0 corresponds to a point located on the centerline of the inclined line. Further, the font drawing circuit 11 calculates the width "W" and height "h" of each rectangular area on the basis of the inclination data and width data associated with the straight line to be processed.

On the other hand, in the case that the line to be processed is a cured line, the font drawing circuit 11 approximates the curved line by employing a plurality of short straight lines. The font drawing circuit 11 firstly determines a number of lines used to approximate the curved line, which may be referred to as the division number, on the basis of the coordinates of the control points of the cured line at Step S03. Furthermore, the font drawing circuit 11 divides the relevant curved line into a set of short straight lines, the total number of which is equal to the division number, and calculates coordinates of both ends of the straight lines obtained by dividing the relevant curved line as the coordinates of the control points of the obtained straight lines at Step S04. The font drawing circuit 11 then executes the above-described process operations defined in the Steps S01 and S02 for each of the obtained straight lines so as to produce the rectangular area data 13.

The rectangular area data 13 determined for the respective rectangular areas are sequentially transmitted to the image memory 12. The pixel data of the pixels located within each rectangular area are simultaneously written into the image memory 12 in response to the rectangular area data 13. This procedure effectively achieves developing the bitmap data 5 onto the image memory 12 in a high speed.

6) Intermediate Summary

As previously explained, the display device 10 of the first embodiment is adapted to concurrently write pixel data of multiple pixels arranged in a rectangular area onto the image memory 12, when the relevant pixels are programmed with the same pixel data, associated with the same color. In other words, the display device 10 is adapted to the pixel data representative of the same colors into a plurality of pixel blocks 33 arranged over a plurality of rows and columns. The display device 10 such designed effectively enhances the access speed to the image memory 12 during developing the bitmap data 5.

The image processing operation executed in the stroke font processing circuit 4 in this embodiment is applicable to the processing of an image that contains a large number of pixels associated with the same color, such as a draw graphic image. In this case, shape data indicative of graphic primitives incorporated within the relevant image is sent to an image processor circuit, and then, this image processing circuit defines a set of rectangular areas for the graphic primitives so that each rectangular area incorporates pixels associated with the same color. The image processing circuit produces rectangular area data that represents a position, a color, a width, and a height of each rectangular area, and writes the pixel data of the pixels within each rectangular area onto the image memory at the same time on the basis of the produced rectangular data. The above-described image processing method achieves high-speed generation of the desired image data associated with the image containing a large number of the same color pixels onto the image memory.

In an alternative embodiment, image data indicative of the shapes of the characters, which does not represent the colors of the characters, may be developed onto the image memory 12 instead of the bitmap-formatted image data (namely, bitmap data 5 constructed of RGB data). For example, binary data may be developed onto image memory 12. In this case, pixel data associated pixels located within a character to be drawn are set to, for example, "1", whereas pixel data of pixels that are not located within the characters are set to, for instance, "0".

Second Embodiment

Figure 11:
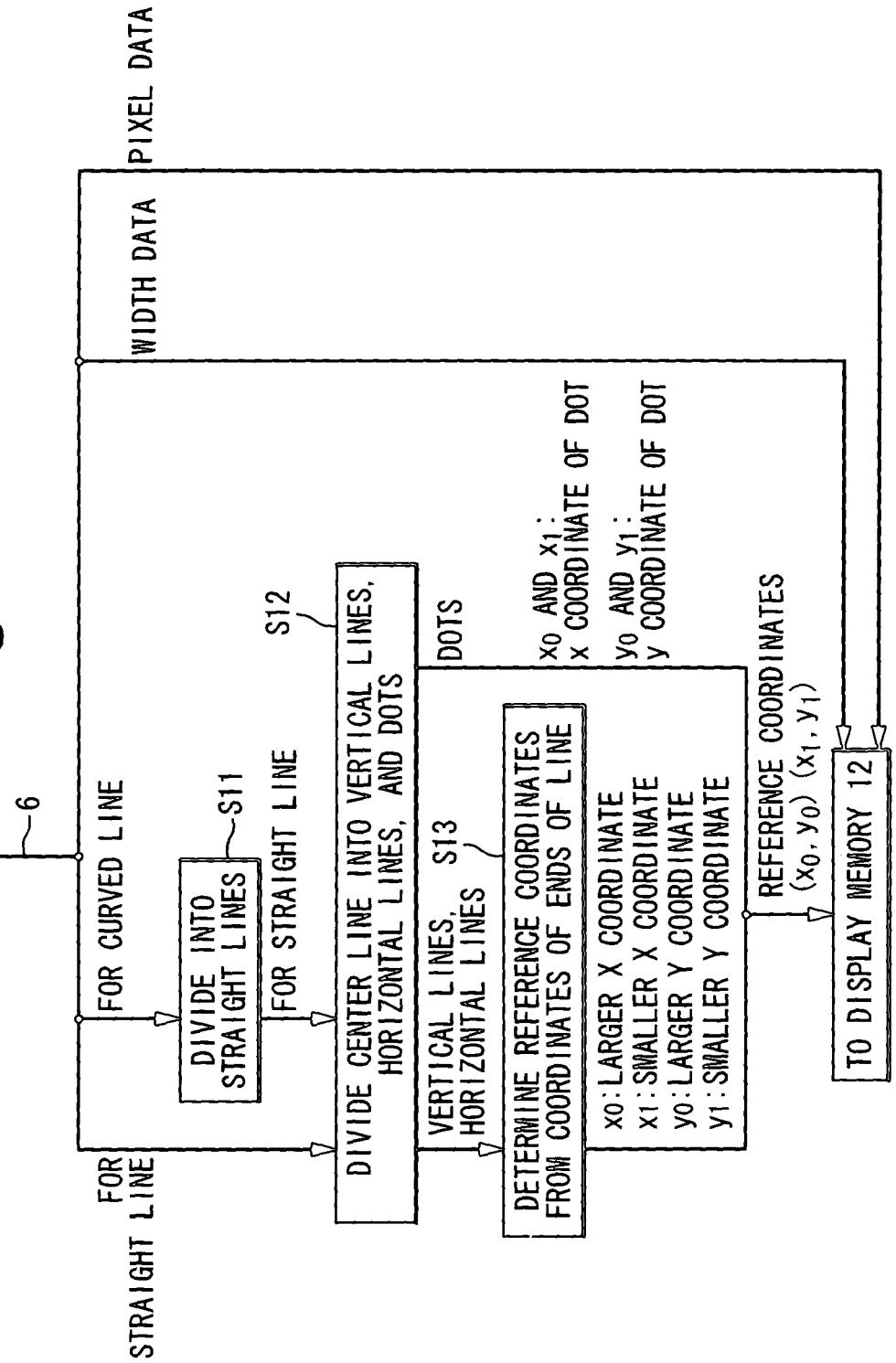
FIG. 11 is a flow chart describing operations of a stroke font drawing circuit employed in a display device in a second embodiment of the present invention.
Figure 12:
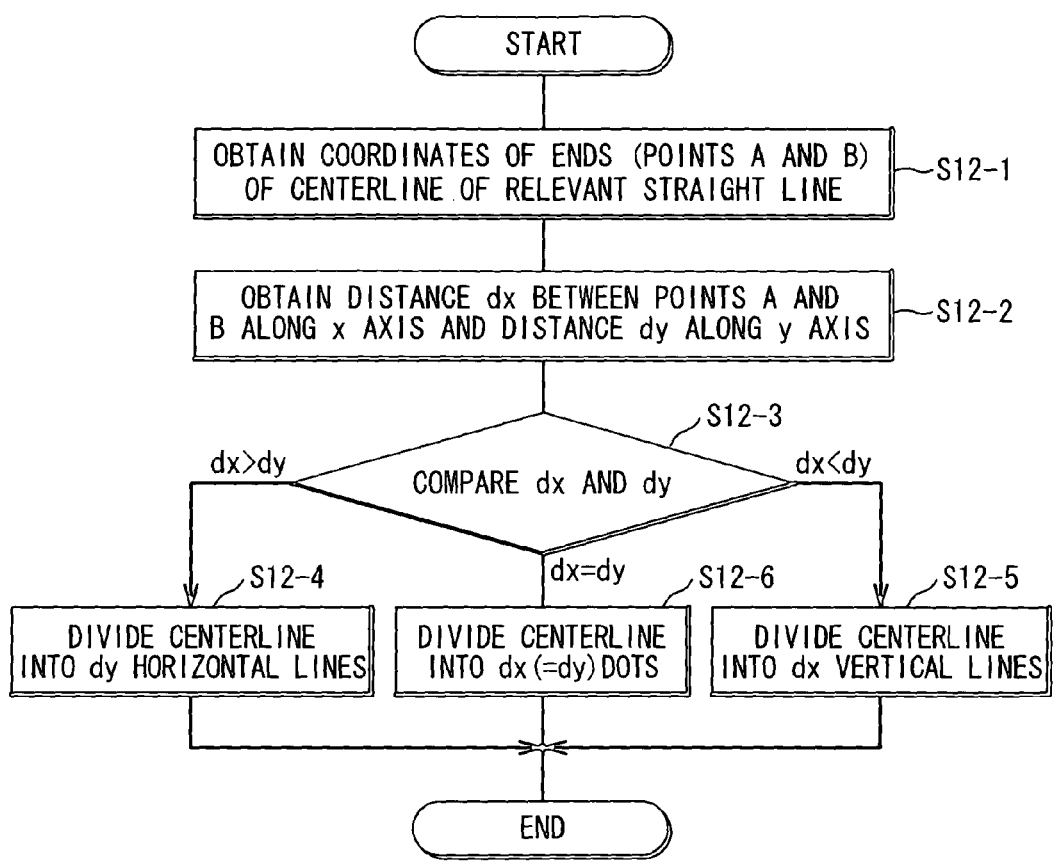
FIG. 12 is a flow chart for describing an algorithm used in the second embodiment for subdividing a centerline of a straight line into a set of vertical lines, horizontal lines, and dots.
Figure 13:
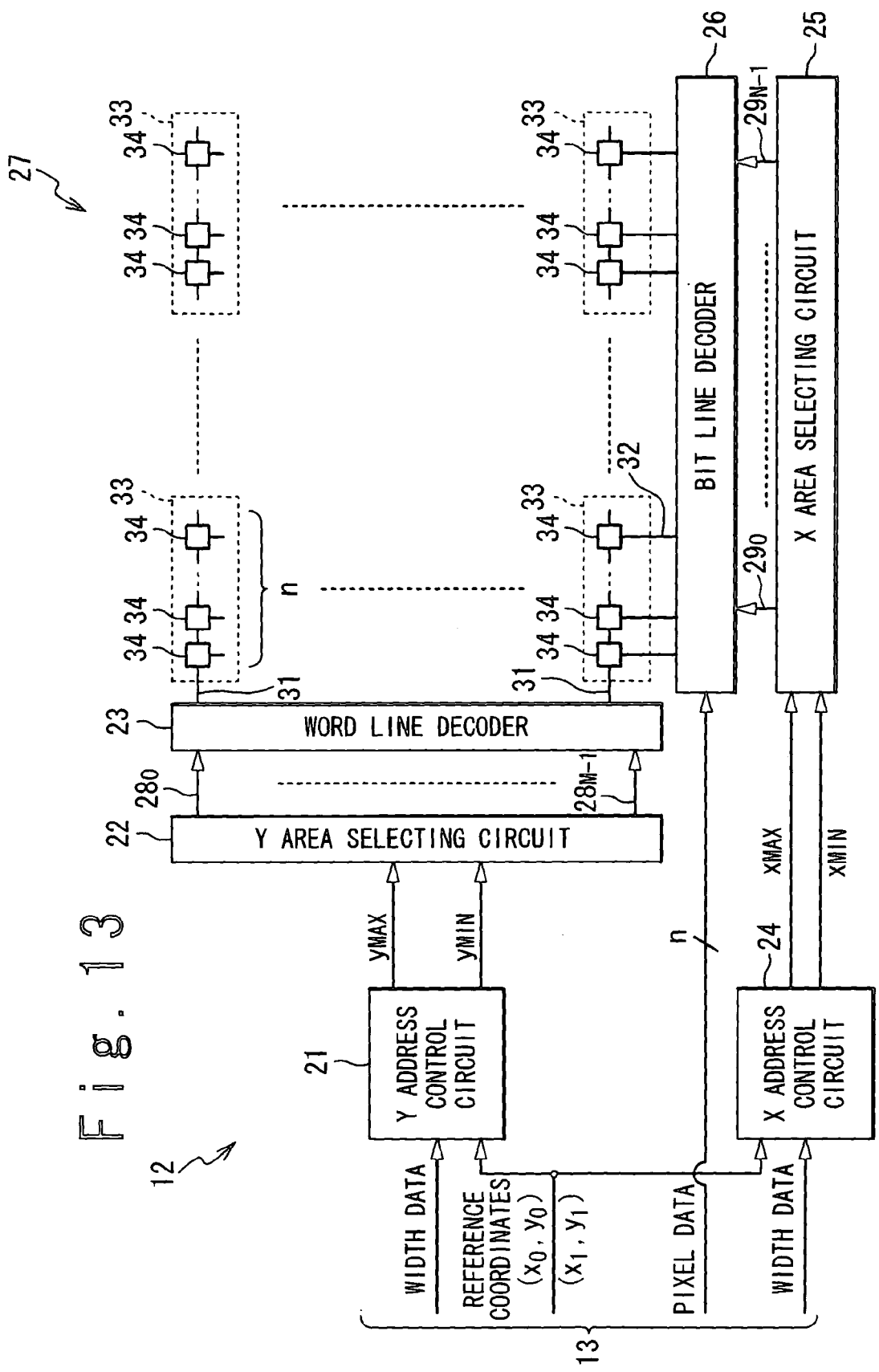
FIG. 13 is a schematic block diagram illustrating an exemplary structure of an image memory in the second embodiment.

In a second embodiment of the present invention, the structure and operations of the display device is modified to reduce an amount of a process operation loaded to the stroke font drawing circuit 11; operations of the stroke font drawing circuit 11 are modified as shown in FIG. 11 and FIG. 12, and the structure of the image memory 12 is also modified as represented in FIG. 13.

FIG. 11 illustrates the operations of the stroke font drawing circuit 11 in the second embodiment. The stroke font drawing circuit 11 performs the operations shown in FIG. 11 for each relevant line incorporated within the characters to be displayed.

For the case that the relevant line is a curved line, the curved line is divided into a set of straight lines at Step S11; for the case that the relevant line is a straight line, Step S11 is skipped.

Subsequently, a centerline of a relevant straight line is subdivided into a set of vertical lines, horizontal line(s), and dots in an approximate manner at Step S12. It should also be understood that the relevant straight line to be processed at Step S12 may be the relevant line to be processed, and one of the straight lines obtained by dividing the curved line.

FIG. 12 is a flow chart representing an algorithm by which the centerline of the relevant straight line is subdivided into a set of vertical line(s), horizontal line(s), and dot(s). First, coordinates of both ends of the centerline of the relevant straight line are obtained at Step S12-1. The ends of the centerline will be referred to as points "A" and "B", hereinafter. At Step S12-2, the stroke font drawing circuit 11 then determines a distance "dx" between the points A and B along the x direction, and another distance "dy" between the points A and B along the y direction. The distances "dx" and "dy" are represented by the following formulas:

$$dx = |x_A - x_B| + 1, \text{ and}$$

$$dy = |y_A - y_B| + 1,$$

where $(x_A, y_A)$ are coordinates of the point A (one end of the centerline), and $(x_B, y_B)$ are coordinates of the point B (the other end of the centerline). The coordinates $x_A, y_A, x_B,$ and $y_B$ are all represented by integers indicative of the addresses of the associated pixels. It should be understood that the distances "dx" and "dy" are also integers, which are obtained from the coordinates $(x_A, y_A)$ and $(x_B, y_B)$.

This is followed by comparing the distance "dx" with the distance "dy" at Step S12-3 to determine whether the centerline of the relevant straight line is a "longitudinal" line, or a "horizontal" line.

When the distance dx is longer than the distance dy, the centerline is divided into "dy" pieces of horizontal lines at Step S12-4. For example, in a case that the coordinates of points A and B, which are the ends of a relevant centerline, are (0, 0) and (5, 1), respectively, the relevant centerline is divided into two horizontal lines: That is, the relevant centerline is subdivided to a first horizontal line having the ends located on the coordinates (0, 0) and (2, 0), and a second horizontal line having the ends located on the coordinates (3, 1) and (5, 1).

Lengths of the horizontal lines obtained through dividing the relevant centerline are given as follows:

(a) The lengths of all the horizontal lines are determined as being "dx/dy" for the case when the distance "dx" is dividable by the distance "dy".

(b) The lengths of "dy−{dx mod dy}" pieces of horizontal lines are determined as being "dx/dy", and the lengths of the remaining "dx mod dy" pieces of the horizontal lines are determined as being "dx/dy−1" for the case that the distance "dx" is not dividable by the distance "dy".

In the case that the distance "dx" is shorter than the distance "dy", on the other hand, the centerline is subdivided into "dx" pieces of vertical lines at Step S12-5. A method for subdividing this centerline into a set of vertical lines is identical to the method for subdividing the centerline into the horizontal lines.

In such a case that the distance "dx" is equal to the distance "dy", the relevant centerline is subdivided into "dx" pieces (="dy" pieces) of dots at Step S12-6.

In the second embodiment, rectangular areas are defined for each of the horizontal lines, the vertical lines, and the dots, which are produced by dividing the centerlines; reference coordinates indicative of a position of each rectangular area are determined for each of the horizontal lines, the vertical lines, and the points.

In this embodiment, two sets of reference coordinates are given for each rectangular area; the two sets of the reference coordinates (x0, y0) and (x1, y1) are defined as follows. For a horizontal line and a vertical line, the reference coordinates (x0, y0) and (x1, y1) are determined from coordinates (xP, yP) and (xQ, yQ) of points "P" and "Q" located on both ends of the horizontal line and the vertical line in accordance with the following formulas:

$$x0 = \max(xP, xQ),$$

$$x1 = \min(xP, xQ),$$

$$y0 = \max(yP, yQ), \text{ and}$$

$$y1 = \min(yP, yQ).$$

On the other hand, as to a dot, the reference coordinates (x0, y0) and (x1, y1) are determined from coordinates (xR, yR) of the relevant dot in accordance with the following formulas:

$$x0 = x1 = xR, \text{ and}$$

$$y0 = y1 = yR.$$

The stroke font drawing circuit 11 produces rectangular area data 13 for each rectangular area so that the rectangular area data 13 incorporates two sets of the reference coordinates (x0, y0) and (x1, y1); the width data; and the pixel data, and supplies the produced rectangular area data 13 to the image memory 12. As will be explained later, the reference coordinates (x0, y0), (x1, y1), and the width data are used to calculate the maximum value $x_{MAX}$ and minimum value $x_{MIN}$ of x addresses of each rectangular area, and also to calculate the maximum value $y_{MAX}$ and minimum value $y_{MIN}$ of y addresses of each rectangular area; the reference coordinates and the width data are representative of the position, the width, and the height of the relevant rectangular area.

In response to the rectangular area data 13, incorporating the reference coordinates (x0, y0), (x1, y1), the width data, and the pixel data), the stroke font drawing circuit 11 writes the pixel data of the associated pixels onto the image memory 12 at the same time for each rectangular area.

Specifically, the y address control circuit 21 calculates the maximum value $y_{MAX}$ and minimum value $y_{MIN}$ of the y addresses of each rectangular area from the reference coordinates (x0, y0), (x1, y1), and the width data. Correspondingly, the x address control circuit 24 calculates the maximum value $x_{MAX}$ and minimum value $x_{MIN}$ of the x addresses of each rectangular area from the reference coordinates (x0, y0), (x1, y1), and the width data.

Various methods may be used for calculating the maximum value $y_{MAX}$, the minimum value $y_{MIN}$, the maximum value $x_{MAX}$, and the minimum value $x_{MIN}$.

In one embodiment, different formulas are used for calculating the maximum value $y_{MAX}$, the minimum value $y_{MIN}$, the maximum value $x_{MAX}$, and the minimum value $x_{MIN}$ depending on whether the width "φ" is an odd number or an even number, the width "φ" being described as the width data within the rectangular area data 13. For a width "φ" being an odd number, the maximum value $x_{MAX}$, the minimum value $x_{MIN}$, the maximum value $y_{MAX}$, and the minimum value $y_{MIN}$ may be calculated by the following formulas:

$$x_{MAX} = x0 + \phi/2,$$

$$x_{MIN} = x1 - \phi/2,$$

$$y_{MAX} = y0 + \phi/2, \text{ and}$$

$$y_{MIN} = y1 - \phi/2.$$

For a width "φ" being an even number, on the other hand, the maximum value $x_{MAX}$, the minimum value $x_{MIN}$, the maximum value $y_{MAX}$, and the minimum value $y_{MIN}$ may be calculated by the following formulas:

$$x_{MAX} = x0 + \phi/2,$$

$$x_{MIN} = x1 - \phi/2 - 1,$$

$$y_{MAX} = y0 + \phi/2, \text{ and}$$

$$y_{MIN} = y1 - \phi/2 - 1.$$

Alternatively, for a width "φ" being an even number, the maximum value $x_{MAX}$, the minimum value $x_{MIN}$, the maximum value $y_{MAX}$, and the minimum value $y_{MIN}$ may be calculated by the following formulas:

$$x_{MAX} = x0 + \phi/2 - 1,$$

$$x_{MIN} = x1 - \phi/2,$$

$$y_{MAX} = y0 + \phi/2 - 1, \text{ and}$$

$$i\ y_{MIN} = y1 - \phi/2.$$

In an alternative embodiment, independently of whether the width "φ" is odd or even, the maximum value $x_{MAX}$, the minimum value $x_{MIN}$, the maximum value $y_{MAX}$, and the minimum value $y_{MIN}$ may be calculated by the following formulas:

$$x_{MAX} = x0 + \phi,$$

$$x_{MIN} = x0,$$

$$y_{MAX} = y0 + \phi, \text{ and}$$

$$y_{MIN} = y0.$$

Instead, the maximum value $x_{MAX}$, the minimum value $x_{MIN}$, the maximum value $y_{MAX}$, the minimum value $y_{MIN}$ may be calculated by the following formulas:

$$x_{MAX} = x0,$$

$$x_{MIN} = x0 - \phi,$$

$$y_{MAX} = y_0, \text{ and}$$

$$y_{MIN} = y0 - \phi.$$

The Y area selecting circuit 22 then selects the y address signals $28_0$ to $28_{M-1}$ in response to the maximum value $y_{MAX}$ and minimum value $y_{MIN}$ of the y addresses of the relevant rectangular area. One or more of the y address signals $28_0$ to $28_{M-1}$ are selected, which are associated with y addresses ranging between the maximum value $y_{MAX}$ and minimum value $y_{MIN}$.

In response to the y address signals $28_0$ to $28_{M-1}$, the word line decoder 23 activates the associated word lines 31. When a plurality of y addresses are selected, two or more of the word lines 31 are activated at the same time. The memory cells 34 connected to the activated word lines 31 are electrically connected to the bit lines 32.

Correspondingly, the X area selecting circuit 25 selects the x address signals $29_0$ to $29_{N-1}$ in response to the maximum value $x_{MAX}$ and minimum value $x_{MIN}$ of the x addresses of the relevant rectangular area. One or more of the x address signals $29_0$ to $29_{N-1}$ are selected, which are associated with x addresses ranging between the maximum value $x_{MAX}$ and minimum value $x_{MIN}$.

In response to the x address signals $29_0$ to $29_{N-1}$, the bit line decoder 26 connects the bit lines 32 associated with the selected x addresses to the signal lines transferring the pixel data to the image memory 12. As a consequence, the pixel data are written into the selected pixel blocks 33. In other words, the data bits of the pixel data are written into the associated memory cells 34 within the selected pixel blocks 33.

An advantageous feature of the display device in the second embodiment is simplicity of the calculation operations performed by the stroke font drawing circuit 11; the amount of processing performed by the stroke font drawing circuit 11 is effectively reduced compared to the first embodiment. This is effective for achieving high-speed "drawing of characters" onto the image memory 12.

Third Embodiment

Figure 14:
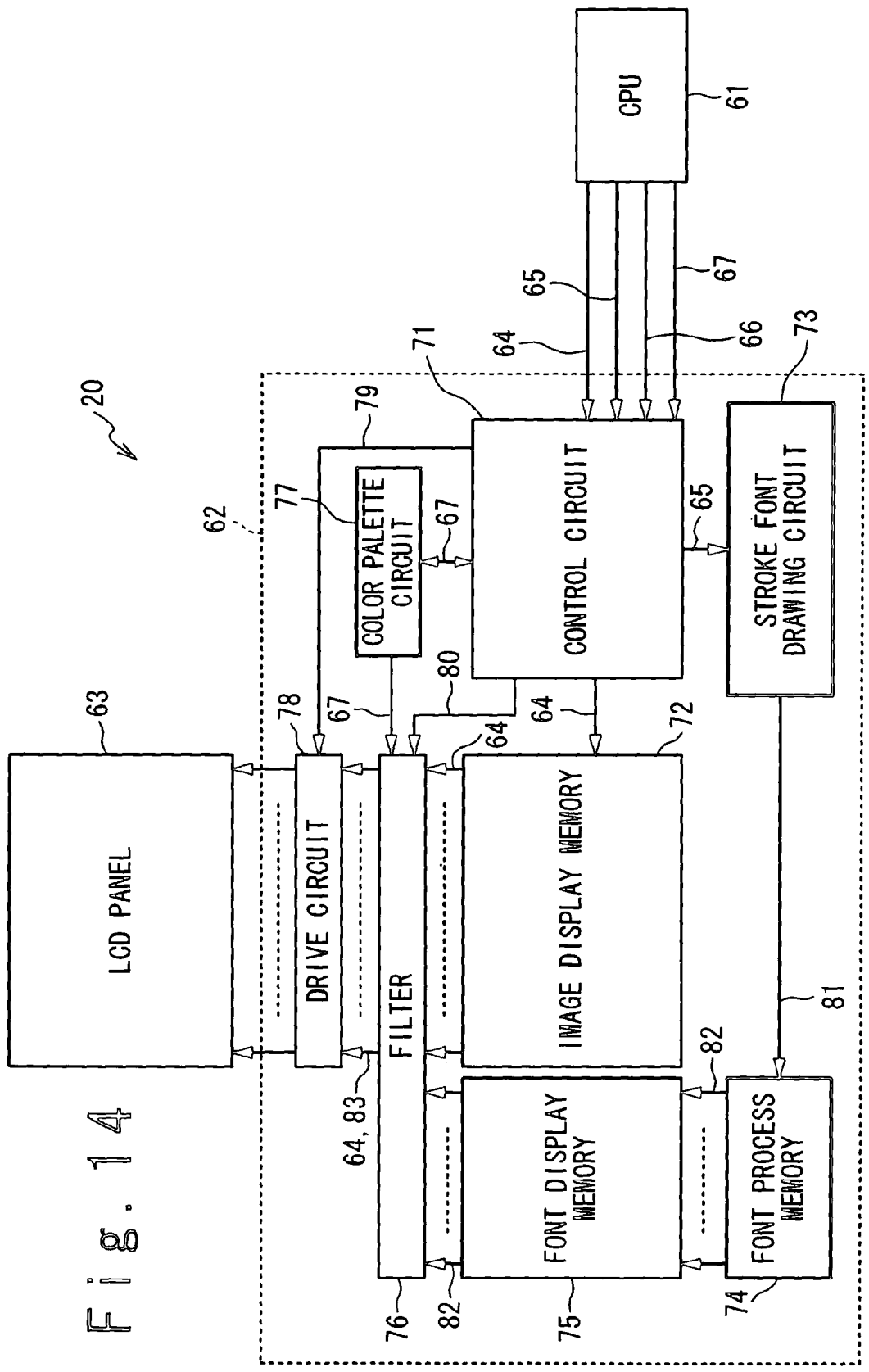
FIG. 14 is a schematic block diagram illustrating an exemplary structure of a display device in a third embodiment of the present invention.

FIG. 14 is a block diagram schematically showing an exemplary of a display device 20 according to a third embodiment of the present invention. The display device 20 of the third embodiment incorporates a control driver adapted to generate pixel data in response to externally inputted stroke font data, and to drive an LCD panel on the basis on the generated pixel data. The generated pixel data are stored in a memory constructed in the same manner as the image memory 12 used in the first and second embodiments, which are designed to write pixel data associated with a plurality of pixels arranged in multiple rows and columns at the same time. A detailed description is made of the display device 20 in the third embodiment.

In the third embodiment, the display device 20 is equipped with a CPU 61, a controller driver 62, and an LCD panel 63 incorporating pixels arranged in a matrix. The CPU 61 provides the controller driver 62 with display data associated to an image to be displayed on the LCD panel 63. The CPU 61 additionally provides a control signal 66, and color palette data 67 for the controller driver 62. The controller driver 62 is responsive to the display data, the control signal 66, and the color palette 67 for driving the LCD panel 63, and thereby displaying a desired image thereon.

The display data, which are supplied from the CPU 61 to the controller driver 62, includes two sorts of data: bitmap data 64 associated with a background image, and font data 65 associated with characters to be superimposed on the background image.

The bitmap data 64 is composed of pixel data represented in an RGB format, indicative of R, G, B, grayscale levels of each pixel.

The font data 65 is represented in a stroke font format, describing characters to be displayed on the LCD panel 63. The use of the stroke font format for transmitting characters to be displayed is effective for reducing the size of the display data. Generally speaking, the size of font data described in a stroke font format is approximately one-fourth of that described in a bitmap format.

In this embodiment, the font data 65 designates the color of each character using of an n-bit color reference number in place of RGB data. It should be noted that the number of usable colors for representing a certain character is equal to $2^n$, when an n-bit color reference number is used for designating the color thereof. The n-bit color reference number are defined so that the number of the usable colors for representing characters is smaller than that of the usable colors for displaying images on the LCD panel 63. In this third embodiment, each color reference number ranges from 0 to 3, represented by two data bits. The use of color reference numbers provides an advantage that the controller driver 62 requires a reduced storage capacity for storing the display data.

The color palette data 67 describes an association of the color reference numbers described in the font data 65 with RGB data associated with usable colors, (namely, sets of data indicative of R, G, B grayscale levels). FIG. 15 is an explanatory diagram conceptually illustrating contents of the above-described color palette data 67. A color reference number of "1", for example, is associated with "blue" (that is, associated with RGB data corresponding to "blue"); another color reference number of "2" is associated with "red" (that is, associated with RGB data corresponding to "red"); and still another color reference number of "3" is associated with "yellow" (that is, associated with RGB data corresponding to "yellow").

Referring back to FIG. 14, the controller driver 62 is equipped with a control circuit 71, an image display memory 72, a stroke font drawing circuit 73, a font process memory 74, a font display memory 75, a filter 76, a color palette circuit 77, and a drive circuit 78. The control circuit 71 is responsive to the control signal 66 received from the CPU 62 for controlling the circuits incorporated within the controller driver 62. Firstly, the control circuit 71 forwards data received from the CPU 61 to the appropriate destination. Specifically, the control circuit 71 forwards the bitmap data 64 to the image display memory 72, while forwarding the font data 65 to the stroke font drawing circuit 73. Furthermore, the control circuit 71 forwards the color palette data 67 to the color palette circuit 77. Finally, the control unit 71 provides a timing control signal 79 for the drive circuit 78 so as to control operation timing of the drive circuit 78, and provides a calculation control signal 80 for the filter 76 in order to indicate a calculation which should be carried out by the filter 76.

The image display memory 72 receives the bitmap data 64, associated with the background image, from the control circuit 71, and stores thereinto the received bitmap data 64.

The stroke font drawing circuit 73 is designed similarly to the stroke font drawing circuit 11 according to the first embodiment (or the second embodiment). The stroke font drawing circuit 73 is designed to acknowledge the shape of each relevant character from the font data 65, and defines a set of rectangular areas so that each rectangular area incorporates pixels associated with the same color. As previously explained, two or more of the rectangular areas may be overlapped with each other. Furthermore, the stroke font drawing circuit 73 produces rectangular area data 81 for each rectangular area. The rectangular area data 81 includes contents similar to those of the rectangular area data 13 of the first embodiment (or the second embodiment). Specifically, each rectangular area data 81 is representative of x and y reference coordinates x0 and y0 of the associated rectangular area, describing the width "W" of the associated rectangular area along an x axis direction and the height "h" thereof along a y axis direction, and the color reference number for designating the color of the associated rectangular area. It should be noted that the color of each rectangular area is designated within the rectangular area data 81 using a color reference number instead of RGB data.

The font process memory 74, designed to similarly to the image memory 12 of the first embodiment (or the second embodiment), stores therein color reference number data 82 composed of pixel data of the characters to be displayed, which represents the colors of the characters using color reference numbers. The font process memory 74 generates the color reference number data 82 on the basis of the rectangular area data 81 received from the stroke font drawing circuit 73. Specifically, the font process memory 74 sequentially receives the rectangular area data 81 from the stroke font drawing circuit 73, and the font process memory 74 writes the color reference number data described in the transmitted rectangular area data 81 into pixel blocks associated with the pixels incorporated within the associated rectangular area at the same time. This achieves the development of the color reference number data 82 onto the font process memory 74 to thereby complete the "drawing of the characters".

The font display memory 75 receives the color reference number data 82 from the font process memory 74, and then stores thereinto the received color reference number data 82. The color reference number data 82 stored in the font display memory 75 is used to display the desired characters on the LCD panel 63.

The filter 76 is designed to synthesize the characters to be displayed with the background image; the filter 76 generates synthesized image bitmap data 83 through executing image calculation, such as on-screen calculation and α blend, for synthesizing the characters with the background image on the LCD panel 63. The filter 76 is responsive to the control signal 80 transmitted from the control circuit 71 for executing the image calculation. When the control signal 80 indicates the filter 76 to display the background image on the LCD panel 63 as it is, the filter 76 simply forwards the bitmap data 64, associated with the background image, from the image display memory 72 to the drive circuit 78. When the control circuit 71 requests the filter 76 to execute image calculation for synthesizing the characters with the background image, on the other hand, the filter 76 receives the bitmap data 64 from the image display memory 72 in units of rows of the pixels, and also receives the color reference data 82 from the font display memory 75 in units of rows of the pixels. Referring to the color palette data 67 stored in the color palette circuit 77, the filter 76 converts the color reference number data 82, which represent the colors of the pixels with color reference numbers, into the corresponding RGB data. The filter 76 performs image calculation on the basis of the RGB data produced by the conversion and the RGB data of the bitmap data 64, to thereby generate the synthesized image bitmap data 83.

The drive circuit 78 receives selected one of the bitmap data 64 of the background image and the synthesized image bitmap data 83 from the filter 76, and drives data lines (not shown) of the LCD panel 63 in response to the received bitmap data 64, or 83. Timing for driving the data lines of the LCD panel 63 is controlled in response to the timing control signal 79 received from the control apparatus 71.

It should be noted that the color reference number data 82 produced in the font process memory 74 is not directly used to display the character on the LCD panel 63. This addresses avoiding incomplete characters being displayed on the LCD panel 63. As previously explained, the generation of the color reference number data 82 onto the font process memory 74 involves sequentially interpreting the commands described in the font data 6; it is not until the process operations of the rectangular area data 81 of the rectangular areas are completed for all the relevant characters, that the color reference number data 82 is accomplished onto the font process memory 74. The time duration required for accomplishing the color reference number data 82 cannot be neglected, as compared with the refresh cycle time of the LCD panel 63. As a consequence, if the color reference number data 82 produced in the font process memory 74 is directly used to be displayed on the LCD panel 63, incomplete characters may be displayed on the LCD panel 63. The architecture in which the font display memory 75 is provided separately from the font process memory 74 effectively avoids incomplete characters being displayed on the LCD panel 63. The controller driver 62 is designed to transfer the color reference number data 82 from the font process memory 74 to the font display memory 75 after completing the color reference number data 82 onto the font process memory 74. The filter 76 and the drive circuit 77 use the completed color reference number data 82 received from the font display memory 75 so as to perform the on-screen display. This effectively avoids incomplete characters being displayed on the LCD panel 63.

FIG. 16 is a block diagram for representing operations of the controller driver 62 for synthesizing desired characters with a background image.

Upon receiving the bitmap data 64 associated with the background image and the font data 65 associated with characters from the CPU 61, the control circuit 71 forwards the bitmap data 64 to the image display memory 72, and the font data 65 to the font drawing circuit 73. The bitmap data 64 is written onto the image display memory 72. In the case that the color palette data 67 is transmitted from the CPU 61, the control circuit 71 forwards the color palette data 67 to the color palette circuit 77.

The font drawing circuit 73 sequentially interprets commands described in the font data 65 to acknowledge the shape of each character to be displayed. The font drawing circuit 73 then defines rectangular areas for each relevant character, and develops the rectangular area data 81 associated with the rectangular areas. This is followed by sequentially forwarding the rectangular area data 81 from the font drawing circuit 73 to the font process memory 74 so as to perform "drawing of the characters" onto the font process memory 74. The pixel data of the complete set of the pixels incorporated within each rectangular area are written into the font process memory 74 at the same time. This effectively enhances the operation speed for completing "drawing of characters". As a result of a completion of "drawing of the characters", color reference number data 82 is produced onto the font process memory 74.

After completing the color reference number data 82 onto the font process memory 74, the color reference number data 82 is transferred to the font display memory 75. The transfer of the color reference number data 82 to the font display memory 75 is carried out within a short time duration, as compared with the refresh cycle of the LCD panel 63.

The filter 76 receives the bitmap data 64 associated with the background image from the image display memory 72, and also receives the color reference number data 82 from the font display memory 75. The filter 76 then produces the synthesized image bitmap data 83 in response to the bitmap data 64 and the color reference number data 82. The filter 76 converts the color reference numbers of the color reference number data 82 into RGB data, and produces the synthesized image bitmap data 83 on the basis of the RGB data obtained by the data conversion and the RGB data of the bitmap data 64. The drive circuit 77 drives the LCD panel 63 in response to the synthesized image bitmap data 83 received from the filter 76, so that the image in which the character has been superimposed on the background image is displayed on the LCD panel 63.

In summary, similarly to the first embodiment, the display device 20 of the third embodiment is designed to write pixel data of multiple pixels arranged in a certain rectangular area onto the font process memory 74 at the same time, when the colors of the relevant pixels are identical to each other, written. This achieves high-speed generation of the color reference data 82 onto the font process memory 74.

In addition, in the display device 20 of the third embodiment, the use of the color reference number data 82, which represents the color of each pixel by an color reference number, effectively reduces the storage capacities of both the font process memory 74 and the font display memory 75.

Finally, the controller driver architecture in this third embodiment effectively reduces the size of the display data transferred to the controller driver 62 through transmitting the font data 65 in a stroke font format. This effectively reduces the power consumption of the controller driver 62.

Although the invention has been described in its preferred form with a certain degree of particularity, it is understood that the present disclosure of the preferred form has been changed in the details of construction and the combination and arrangement of parts may be resorted to without departing from the scope of the invention as hereinafter claimed.

What is claimed is:

1. An image memory comprising:
   a memory cell array including memory elements arrayed in rows and columns, each of said memory elements storing pixel data;
   a first area selecting circuit selecting a plurality of row addresses at a same time;
   a second area selecting circuit selecting a plurality of column addresses at a same time; and
   a write circuit writing same pixel data into selected memory elements out of said memory elements, said selected memory elements being associated with said selected row addresses and column addresses,
   wherein the first area selecting circuit receives a maximum value of the selected row addresses and a minimum value of the selected row addresses, and the first area selecting circuit provides a set of row address signals in response to the maximum value and the minimum value for the write circuit to write the same pixel data into the selected memory cells.

2. The image memory according to claim 1, wherein said memory cell array further includes a plurality of word lines extending in a first direction,
   wherein each of said memory elements includes a set of memory cells arrayed in said first direction, said set of memory cells being connected to associated one of said word lines,
   wherein said first area selecting circuit provides said write circuit with a set of row address signals indicative of said selected row addresses, and
   wherein said write circuit includes a word line decoder responsive to said set of row address signals for selecting at least one of said word lines, said at least one of said word lines being associated with said selected row addresses.

3. The image memory according to claim 2, wherein said first area selecting circuit is designed to receive a maximum value $y_{MAX}$ of said selected row addresses, and a minimum value $y_{MIN}$ of said selected row addresses, and to develop said set of row address signals in response to said maximum value $y_{MAX}$ and said minimum value,
   wherein said set of row address signals comprises first to M-th row address signals,
   wherein said first area selecting circuit includes:
      first and second common terminals having selected one of power and ground potentials;
      first to (M+1)-th serial switches series-connected between said first and second common terminals;
      first to M-th terminals having another one of said power and ground potentials;
      first to M-th nodes, i-th node of which being connected between said i-th serial switch and said (i+1)-th serial switch; and
      first to M-th parallel switches, i-th parallel switch of which being connected between said i-th terminal and said i-th node; and
      a logic circuit,
   wherein i-th row address signal is generated in response to a potential of said i-th node,
   wherein said logic circuit is designed to turn on said yMIN-th serial switch and (yMAX+1)-th serial switch, and to turn off remaining ones of said first to (M+1)-th serial switches, and
   wherein said logic circuit is designed to turn on at least one of said yMIN-th to (yMAX)-th parallel switches, and to turn off remaining ones of said first to M-th parallel switches.

4. The image memory according to claim 3, wherein said logic circuit is designed to turn on multiple ones of said yMIN-th to (yMAX)-th parallel switches.

5. The image memory according to claim 3, wherein said first area selecting circuit further includes first to M-th precharge switches connected to said first to M-th nodes, respectively, said first to M-th precharge switches being designed to provide said first to M-th nodes with said selected one of said power and ground potential, in response to a precharge signal.

6. The image memory according to claim 2, wherein said memory cell array further includes a plurality of bit lines extending in a second direction;
   wherein said second area selecting circuit provides said write circuit with a set of column address signals indicative of said selected column addresses, and
   wherein said write circuit includes a bit line decoder responsive to said set of column address signals for selecting at least one of said bit lines, said at least one of said bit lines being associated with said selected column addresses.

7. The image memory according to claim 1, wherein the second area selecting circuit receives a maximum value of the selected column addresses and a minimum value of the selected column addresses, and the second area selecting circuit develops a set of column address signals in response to the maximum value and the minimum value for the write circuit to write the same pixel data into the selected memory cells.

8. The image memory according to claim 1, wherein the first area selecting circuit selects any of the plurality of row addresses at the same time, and
   wherein the second area selecting circuit selects any of the plurality of column addresses at the same time.

9. The image memory according to claim 1, wherein the write circuit simultaneously writes the same pixel data into the selected memory elements out of any of the memory elements.

10. An image memory comprising:
    a memory cell array including memory elements arrayed in rows and columns, each of said memory elements storing pixel data;

a first area selecting circuit selecting a plurality of row addresses at a same time;

a second area selecting circuit selecting a plurality of column addresses at a same time; and a write circuit writing same pixel data into selected memory elements out of said memory elements, said selected memory elements being associated with said selected row addresses and column addresses, wherein the writing of same pixel data by the write circuit into the selected memory elements from the first area selecting circuit and the second area selecting circuit is provided according to an index of color of an area of an image having the same color and reference coordinates of the area of the image.

11. An image memory comprising:

a memory cell array including memory elements arrayed in rows and columns, each of said memory elements storing pixel data;

a first area selecting plurality of row addresses at a same time;

a second area selecting circuit selecting a plurality of column addresses at a same time; and a write circuit writing same pixel data into selected memory elements out of said memory elements, said selected memory elements being associated with said selected row addresses and column addresses, wherein the first area selecting circuit selects the plurality of row addresses according to a first range of values, the first range of values determined according to a height and reference coordinate of an area within an image with the same pixel data, and wherein the second area selecting circuit selects the plurality of column addresses according to a second range of values, the second range of values determined according to a width and reference coordinates of an area within an image with the same pixel data.

12. The image memory according to claim 11, wherein the area within the image is defined by a rectangular area and the reference coordinates are according to a shape of a line to be drawn in the image.

* * * * *